US007586519B2

(12) United States Patent
Nomura et al.

(10) Patent No.: US 7,586,519 B2
(45) Date of Patent: Sep. 8, 2009

(54) OPTICAL APPARATUS USING FLEXIBLE PRINTED WIRING BOARD

(75) Inventors: Hiroshi Nomura, Saitama (JP); Kosei Kosako, Tokyo (JP); Shinya Suzuka, Saitama (JP); Masahiro Inazuka, Saitama (JP); Ken Endo, Saitama (JP)

(73) Assignee: HOYA Corporation, Tokyo (JP)

( * ) Notice: Subject to any disclaimer, the term of this patent is extended or adjusted under 35 U.S.C. 154(b) by 527 days.

(21) Appl. No.: 11/536,421

(22) Filed: Sep. 28, 2006

(65) Prior Publication Data

US 2007/0077805 A1 Apr. 5, 2007

(30) Foreign Application Priority Data

Sep. 30, 2005 (JP) ............................ P2005-288608
Aug. 31, 2006 (JP) ............................ P2006-235175

(51) Int. Cl.
H40N 5/228 (2006.01)
H40N 5/225 (2006.01)
G03B 17/00 (2006.01)

(52) U.S. Cl. ..................... 348/208.4; 348/373; 396/542

(58) Field of Classification Search ......... 348/373–376; 396/73, 270, 348
See application file for complete search history.

(56) References Cited

U.S. PATENT DOCUMENTS

| 4,803,557 | A | * | 2/1989 | Bridges | ...................... 348/374 |
| 5,398,163 | A | | 3/1995 | Sano | |
| 5,581,412 | A | | 12/1996 | Tanaka | |
| 5,809,361 | A | | 9/1998 | Nomura et al. | |
| 5,826,126 | A | | 10/1998 | Nomura et al. | |
| 5,917,158 | A | | 6/1999 | Takao et al. | |
| 6,112,034 | A | | 8/2000 | Takao et al. | |
| 6,118,666 | A | | 9/2000 | Aoki et al. | |
| 6,831,682 | B1 | * | 12/2004 | Silverbrook et al. | ..... 348/207.2 |
| 7,006,143 | B1 | * | 2/2006 | Silverbrook | ................ 348/373 |
| 7,043,154 | B2 | | 5/2006 | Nomura | |

(Continued)

FOREIGN PATENT DOCUMENTS

JP  55104205 U  7/1980

(Continued)

OTHER PUBLICATIONS

U.S. Appl. No. 11/477,697 to Nomura et al., filed Jun. 30, 2006.

(Continued)

*Primary Examiner*—Nhan T Tran
*Assistant Examiner*—Trung Diep
(74) *Attorney, Agent, or Firm*—Greenblum & Bernstein, P.L.C.

(57) ABSTRACT

An optical apparatus including an electrical component which is movable in a plane, and a flexible printed wiring board in the shape of a strip, the widthwise direction thereof being parallel to the plane, which connects the electrical component to a stationary board, wherein the flexible printed wiring board includes a folded extension portion which firstly extends in a direction substantially orthogonal to the plane and is subsequently folded back at a folded portion to extend in a direction opposite thereto; and at least one slit which is provided to pass through the folded portion and to split at least a part of the folded extension portion into at least two split portions thereof in the widthwise direction of the flexible printed wiring board.

15 Claims, 25 Drawing Sheets

U.S. PATENT DOCUMENTS

| | | | |
|---|---|---|---|
| 7,190,404 B2 * | 3/2007 | Shinomiya | 348/374 |
| 7,436,435 B2 * | 10/2008 | Wada | 348/208.4 |
| 7,477,291 B2 * | 1/2009 | Seo | 348/208.7 |
| 7,499,635 B2 * | 3/2009 | Tanaka et al. | 396/55 |
| 2006/0082658 A1 * | 4/2006 | Lee et al. | 348/208.7 |
| 2006/0115261 A1 | 6/2006 | Nomura | |

FOREIGN PATENT DOCUMENTS

| | | |
|---|---|---|
| JP | 59-224012 | 12/1984 |
| JP | 6083268 U | 6/1985 |
| JP | 5-48218 | 2/1993 |
| JP | 9-298626 | 11/1997 |
| JP | 10-335759 | 12/1998 |
| JP | 11-8455 | 1/1999 |
| JP | 11-305143 | 11/1999 |
| JP | 2004-55342 | 2/2004 |
| JP | 2005-57259 | 3/2005 |
| JP | 2006-157833 | 6/2006 |

OTHER PUBLICATIONS

U.S. Appl. No. 11/477,475 to Nomura et al., filed Jun. 30, 2006.
English language Abstract of JP 2006-157833.
English language Abstract of JP 5-48218.
English language Abstract of JP 9-298626.
English language Abstract of JP 10-335759.
English language Abstract of JP 11-305143.
English language Abstract of JP 2004-55342.
English language Abstract of JP 2005-57259.
English language Abstract of JP 11-8455.

* cited by examiner

Moving Direction of CCD
(X-axis Direction)

Moving Direction of CCD
(X-axis Direction)

Moving Direction of CCD
(X-axis Direction)

Moving Direction of CCD
(X-axis Direction)

OPTICAL APPARATUS USING FLEXIBLE PRINTED WIRING BOARD

BACKGROUND OF THE INVENTION

1. Field of the Invention

The present invention relates to an optical apparatus, more specifically relates to a structure of a flexible printed wiring board which is connected to a movable electrical component provided in an optical apparatus.

2. Description of the Related Art

A flexible printed wiring board is commonly used to electrically connect a movable electrical component to a stationary board such as a stationary circuit board. In many cases, a clearance is given to the length of the flexible printed wiring board in the direction of movement of the electrical component to reduce a resistance (or frictional resistance) in the flexible printed wiring board to movements of the electrical component by drawing or folding the flexible printed wiring board when the electrical component moves.

However, if the motion of the electrical component is not a simple linear motion in one direction, e.g., if the electrical component is movable in not only the longitudinal direction (lengthwise direction) of a long and narrow flexible printed wiring board but also the widthwise direction thereof, the flexible printed wiring board may be acted upon by a force which twists the flexible printed wiring board in the widthwise direction thereof to thereby increase the aforementioned resistance. If this resistance is great, it exerts a harmful effect on the driving accuracy of the electrical component, and the loads on motors and actuators for the electrical component increase. To reduce such a resistance in the flexible printed wiring board to movements of the electrical component, it is conceivable to increase flexibility of the flexible printed wiring board itself. However, the production cost of the flexible printed wiring board itself increases as the flexible printed wiring board is made of a material having a greater flexibility.

For instance, the assignee of the present invention has proposed a type of optical apparatus in United States Patent Publication No. US-2006-0115261-A1 (U.S. patent application Ser. No. 11/289,602), in which image shake of an object image formed on an image pickup device is counteracted by movements of the image pickup device. However, in this type of optical apparatus, since the image pickup device, which is an electrical component, is moved in different directions in a plane orthogonal to an optical axis, it is necessary to consider a resistance such as the aforementioned resistance in the flexible printed wiring board to movements of the image pickup device in the widthwise direction of the flexible printed wiring board. Specifically, the number of conductor traces contained in the flexible printed wiring board tends to be greater to thereby cause a widening of the flexible printed wiring board as the number of pixels of the image pickup device increases, and accordingly, it is desirable to reduce the aforementioned resistance to a minimum even in the case of adopting a wide flexible printed wiring board.

SUMMARY OF THE INVENTION

The present invention provides an optical apparatus containing an electrical component, wherein the electrical component is positioned in an optical system and moves in a plane orthogonal to an optical axis, the electrical component is electrically connected to a stationary board via a flexible printed wiring board, and a resistance in the flexible printed wiring board to movements of the electrical component is reduced by a simple structure at a low cost, while the image pickup device can be driven stably with a high degree of accuracy.

According to an aspect of the present invention, an optical apparatus including an electrical component which is movable in a plane, and a flexible printed wiring board in the shape of a strip, a widthwise direction thereof being parallel to the plane, which connects the electrical component to a stationary board, wherein the flexible printed wiring board includes a folded extension portion which firstly extends in a direction substantially orthogonal to the plane and is subsequently folded back at a folded portion to extend in a direction opposite thereto; and at least one slit which is provided to pass through the folded portion and to split at least a part of the folded extension portion into at least two split portions thereof in the widthwise direction of the flexible printed wiring board.

It is desirable for the slit to be elongated in a substantially lengthwise direction of the flexible printed wiring board.

It is desirable for the folded extension portion to include a pair of parallel flat portions between which the folded portion of the folded extension portion is provided, the pair of parallel flat portions extending substantially orthogonal to the plane, and for the slit to extend over the pair of parallel flat portions through the folded portion of the folded extension portion.

It is desirable for the electrical component to be linearly movable in the plane in a first direction parallel to a widthwise direction of the folded extension portion and a second direction substantially orthogonal to the first direction. The flexible printed wiring board includes an intermediate flat portion installed between the folded extension portion and the electrical component to extend substantially parallel to the second direction. The slit extends from the folded extension portion to the intermediate flat portion.

It is desirable for the flexible printed wiring board to include a plurality of the slits provided at different positions in the widthwise direction thereof.

It is desirable for the electrical component to include an image pickup device.

It is desirable for the optical apparatus to include an image stabilizing device which moves the image pickup device in the plane that is parallel to an imaging surface of the image pickup device in accordance with a magnitude and a direction of shake applied to an optical system to offset image shake of an object image formed on the imaging surface.

It is desirable for the folded extension portion to be installed to extend forward relative to a plane in which an imaging surface of the image pickup device lies.

It is desirable for the optical apparatus to include a shake correcting lens group movable in directions orthogonal to an optical axis of an optical system. The electrical component serves as a component of a drive mechanism which moves the shake correcting lens in a plane orthogonal to the optical axis in accordance with a magnitude and a direction of shake applied to the optical system to offset image shake of an object image formed on an imaging surface.

It is desirable for the optical apparatus to be a digital camera, and for the electrical component to be one of an image pickup device and a board to which drive coils are fixed.

It is desirable for the slit to be elongated in a direction substantially parallel to conductive traces provided in the flexible printed wiring board.

It is desirable for the slit to have a sufficient width so that each the split portions do not interfere with each other even if twisted in response to movements of the electrical component when the electrical component is moved.

In an embodiment, an optical apparatus is provided, including an electrical component which is movable in a plane, and a flexible printed wiring board in the shape of a strip, the widthwise direction thereof being parallel to the plane, which connects the electrical component to a stationary board, wherein the flexible printed wiring board includes first and second flat portions which extend in a direction substantially orthogonal to the plane respectively; a folded portion which connects the first flat portion and the second flat portion; and at least one slit which is provided to pass through the folded portion and to split the folded portion into at least two split portions thereof in the widthwise direction of the flexible printed wiring board.

In an embodiment, an optical apparatus is provided, including an image pickup device which is movable in a plane substantially parallel to an imaging surface, and a flexible printed wiring board in the shape of a strip which connects the image pickup device to a stationary board, wherein the flexible printed wiring board includes a folded extension portion which firstly extends in a direction substantially orthogonal to the plane and is subsequently folded back to extend in a direction opposite thereto, and at least one slit which is provided in the flexible printed wiring board to pass through at least a folded portion of the folded extension portion and to split at least a part of the flexible printed wiring board which includes the folded extension portion into at least two split portions thereof in a widthwise direction of the flexible printed wiring board.

In an embodiment, an optical apparatus is provided, including a shake-correction unit driven magneto-electrically in a plane orthogonal to an optical axis, and a flexible printed wiring board in the shape of a strip which connects the shake-correction unit to a stationary board, wherein the flexible printed wiring board includes a folded extension portion which firstly extends in a direction substantially orthogonal to the plane and is subsequently folded back to extend in a direction opposite thereof, and at least a portion of the flexible printed wiring board which includes the folded extension portion is split into at least two split portions in a widthwise direction of the flexible printed wiring board so that the two split portions are elongated in a lengthwise direction of the flexible printed wiring board and so that the two split portions do not interfere with each other even if twisted in response to movements of the shake-correction unit when the shake-correction unit is driven.

According to the present invention, an optical apparatus is provided containing an electrical component, wherein the electrical component is positioned in an optical system and moves in a plane orthogonal to an optical axis, the electrical component is electrically connected to a stationary board via a flexible printed wiring board, and a resistance in the flexible printed wiring board to movements of the electrical component is reduced by a simple structure at a low cost, while the image pickup device can be driven stably with a high degree of accuracy.

The present disclosure relates to subject matter contained in Japanese Patent Applications Nos. 2005-288608 (filed on Sep. 30, 2005) and 2006-235175 (filed on Aug. 31, 2006), which are expressly incorporated herein by reference in their entireties.

BRIEF DESCRIPTION OF THE DRAWINGS

The present invention will be described below in detail with reference to the accompanying drawings in which.

DESCRIPTION OF THE PREFERRED EMBODIMENTS

Figure 1:
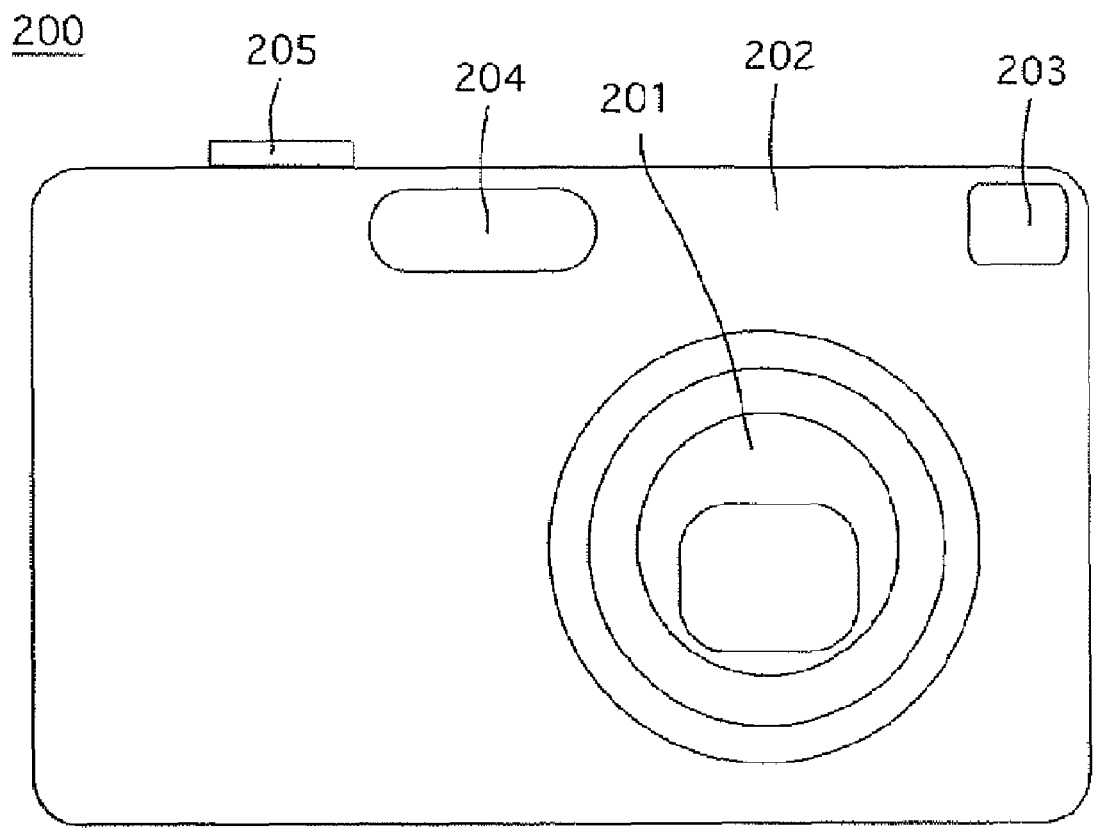
FIG. 1 is a front elevational view of a digital camera having an embodiment of an optical apparatus according to the present invention.

FIG. 1 shows an outward appearance of a digital camera 200 which incorporates a flexible printed wiring board according to the present invention. The digital camera 200 is provided on the front of a camera body 202 thereof with a zoom lens (zoom lens barrel) 201, an optical viewfinder 203 and a flash 204, and is provided on the top of the camera body 202 with a shutter button 205.

Figure 2:
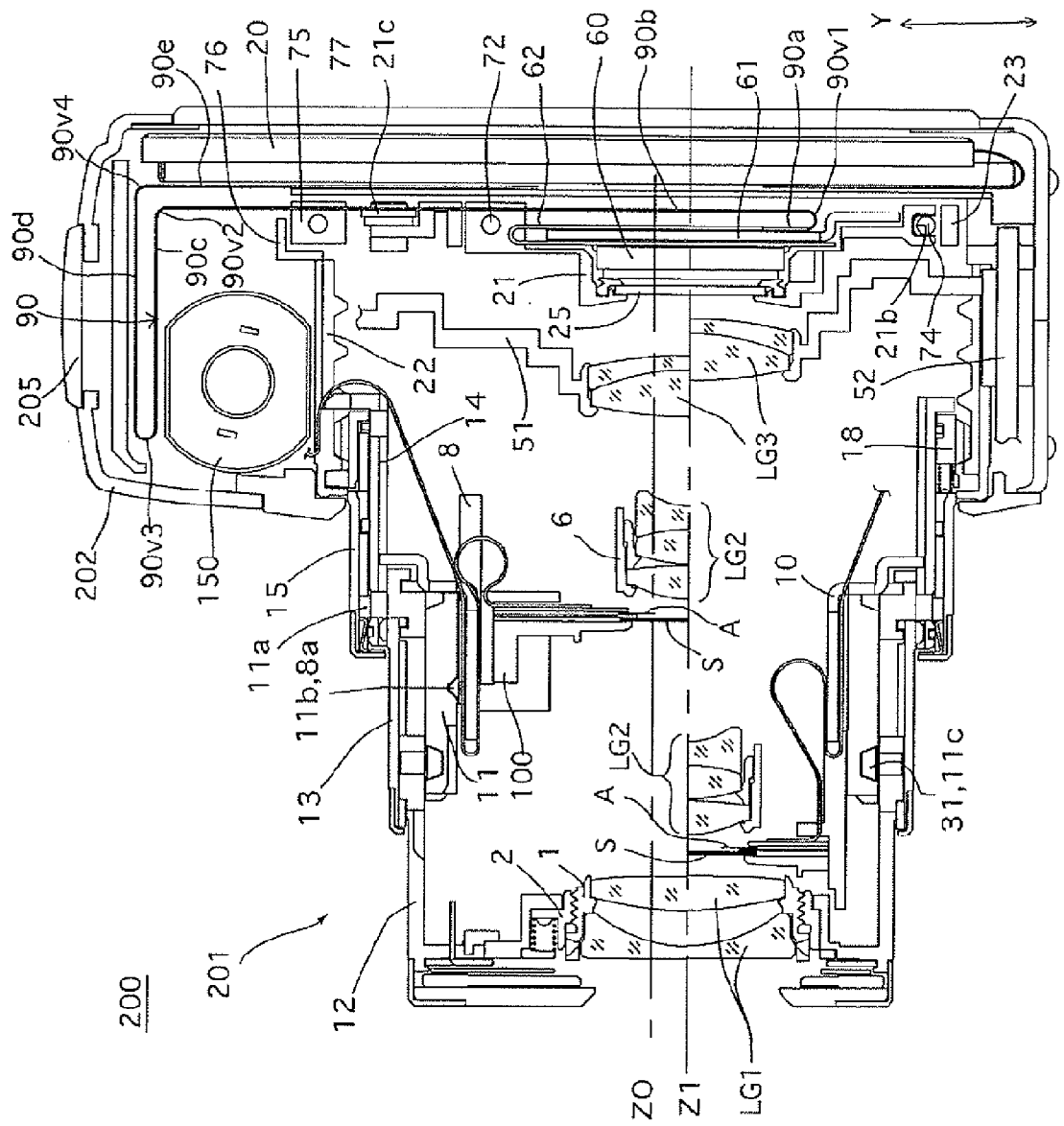
FIG. 2 is a longitudinal sectional view of the digital camera shown in FIG. 1 in a ready-to-photograph state of the zoom lens thereof.
Figure 3:
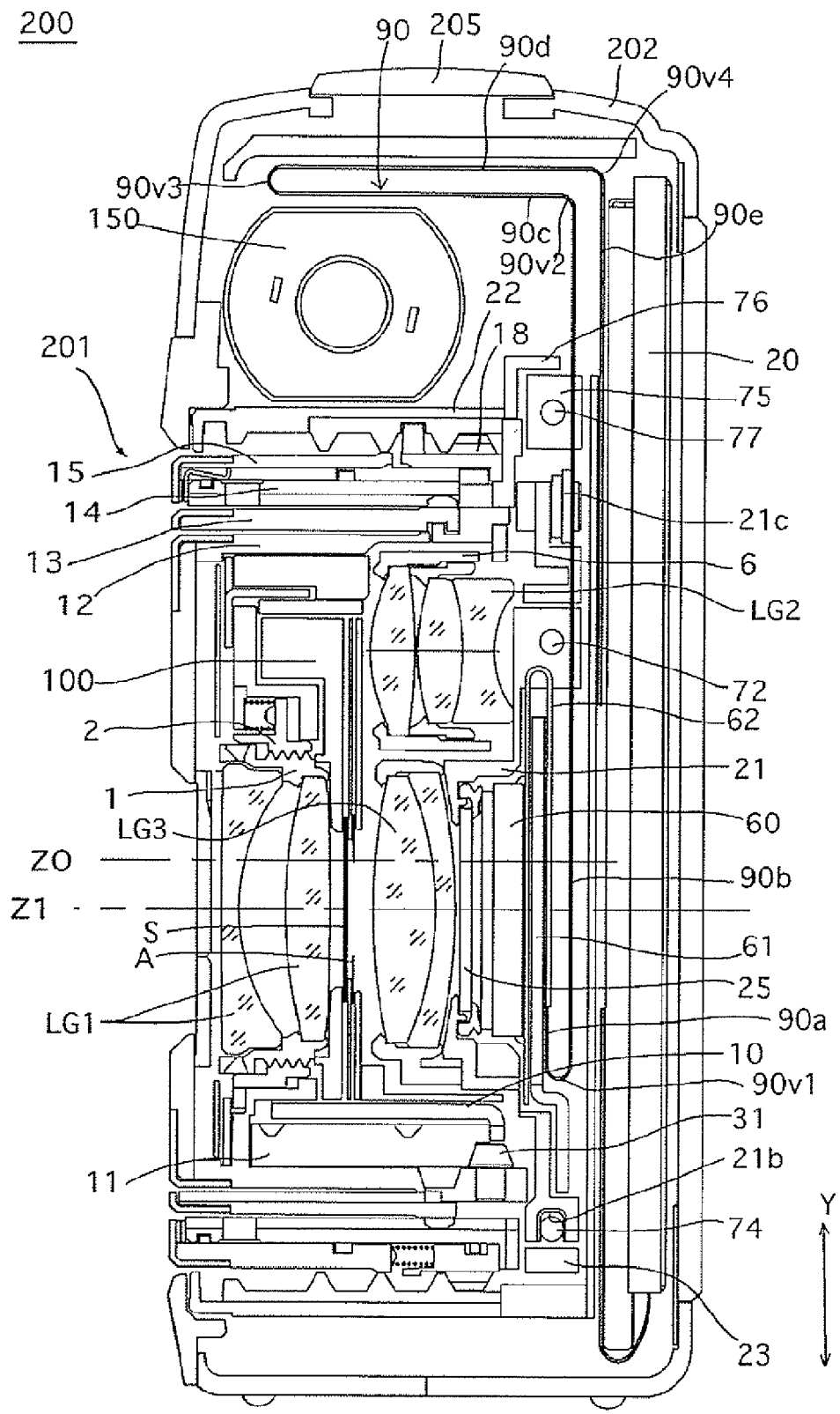
FIG. 3 is a longitudinal sectional view of the digital camera shown in FIG. 1 in the fully-retracted state of the zoom lens.
Figure 6:
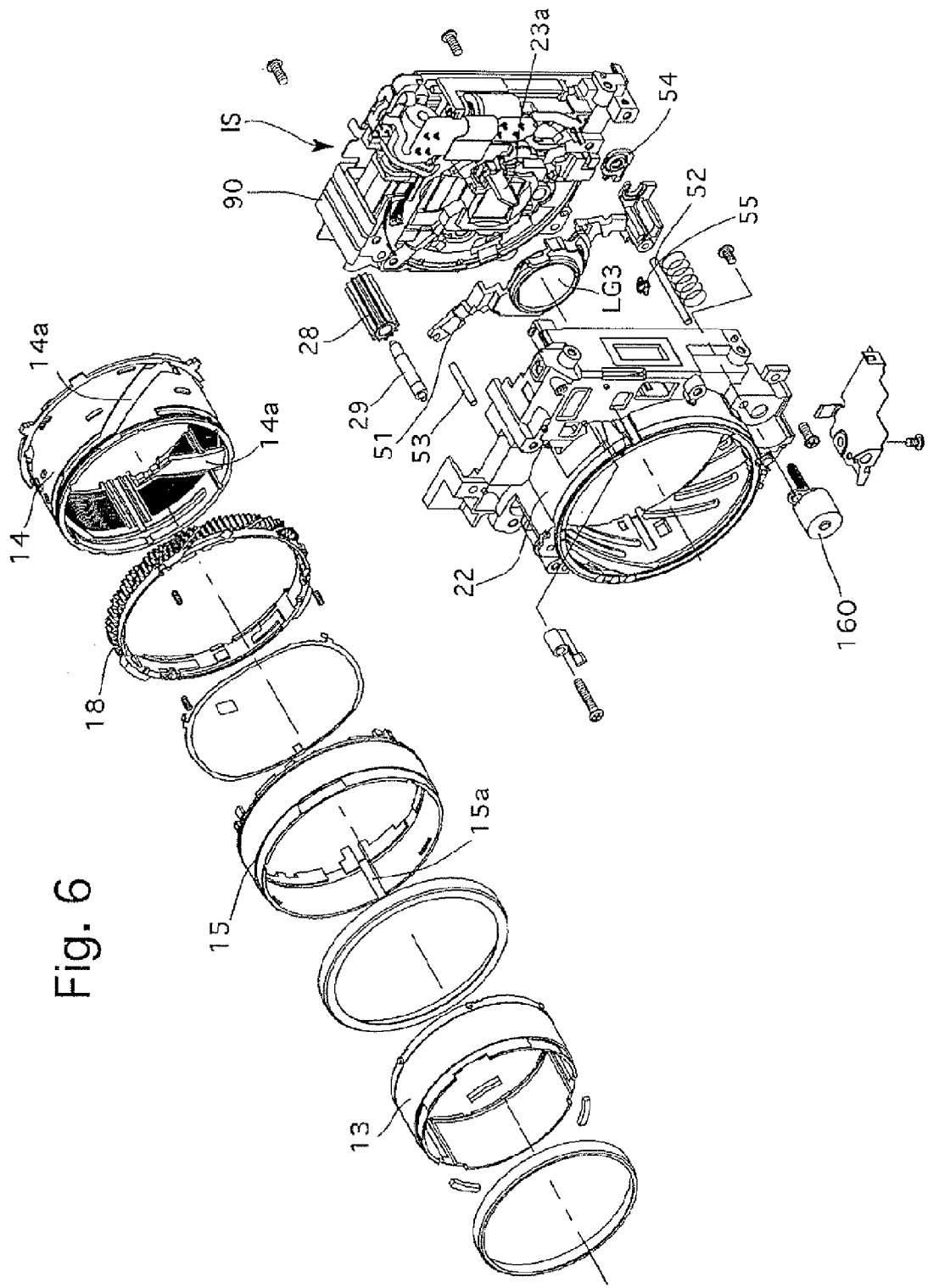
FIG. 6 is an exploded perspective view of a portion of the zoom lens shown in FIG. 4.
Figure 7:
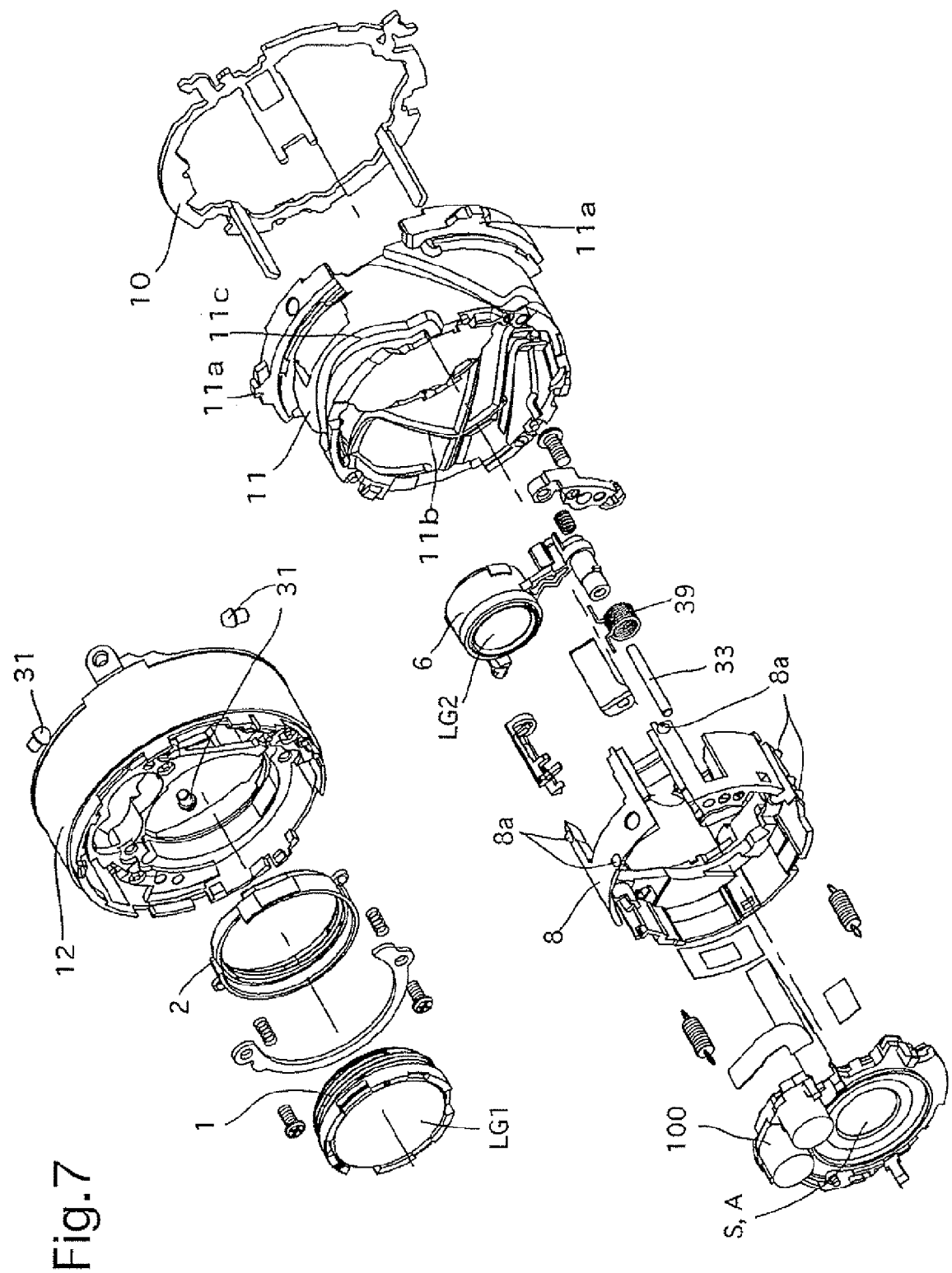
FIG. 7 is an exploded perspective view of another portion of the zoom lens shown in FIG. 4.

The zoom lens 201 of the digital camera 200, longitudinal sectional views of which are shown in FIGS. 2 and 3, is driven to advance toward the object side (leftward viewed in FIGS. 2 and 3) from the camera body 202 as shown in FIG. 2 during a photographing operation. When photography is not carried out, the digital camera 200 moves from a ready-to-photograph state shown in FIG. 2 to a fully-retracted state shown in FIG. 3 in which the zoom lens 201 is accommodated (fully retracted) in the camera body 202 as shown in FIG. 3. In FIG. 2, the upper half and the lower half of the zoom lens 201 from a photographing optical axis Z1 show the ready-to-photograph state of the zoom lens 201 at the wide-angle extremity and the telephoto extremity, respectively. As shown in FIGS. 6 and 7, the zoom lens 201 is provided with a plurality of ring members (hollow-cylindrical members): a second linear guide ring 10, a cam ring 11, a third movable barrel 12, a second movable barrel 13, a first linear guide ring 14, a first movable barrel 15, a helicoid ring 18 and a stationary barrel 22 which are substantially concentrically arranged about a common axis that is shown as a lens barrel axis Z0 in FIGS. 2 and 3.

The zoom lens 201 is provided with a photographing optical system including of a first lens group LG1, a shutter S, an adjustable diaphragm A, a second lens group LG2, a third lens group LG3, a low-pass filter 25 and a CCD image sensor (electrical component/shake-correction unit) 60 that serves an image pickup device. Optical elements from the first lens group LG1 to the CCD image sensor 60 are positioned on the photographing optical axis (common optical axis) Z1 when the zoom lens 201 is in a ready-to-photograph state. The photographing optical axis Z1 is parallel to the lens barrel axis Z0 and positioned below the lens barrel axis Z0. The first lens group LG1 and the second lens group LC2 are moved along the photographing optical axis Z1 in a predetermined moving manner to perform a zooming operation, and the third lens group LG3 is moved along the photographing optical axis Z1 to perform a focusing operation. In the following description, the term "optical axis direction" refers to a direction parallel to the photographing optical axis Z1 and the terms "object side" and "image side" refer to forward and rearward of the digital camera 200, respectively. Additionally, in the following description, the vertical direction and the horizontal direction of the digital camera 200 in a plane orthogonal to the photographing optical axis Z1 refer to a Y-direction and an X-direction, respectively.

The stationary barrel 22 is positioned in the camera body 202 and fixed thereto, while a stationary holder 23 is fixed to a rear portion of the stationary barrel 22. The CCD image sensor 60 and the low-pass filter 25 are supported by the stationary holder 23 via a Y-direction moving stage 71 and an X-direction moving stage 21 to be movable in the X-direction and the Y-direction. The digital camera 200 is provided behind the stationary holder 23 with an LCD panel 20 which indicates visual images and various photographic information.

The zoom lens 201 is provided in the stationary barrel 22 with a third lens frame 51 which supports and holds the third lens group LG3. The zoom lens 201 is provided between the stationary holder 23 and the stationary barrel 22 with a pair of guide shafts 52 and 53 which extend parallel to the photographing optical axis Z1 to guide the third lens frame 51 in the optical axis direction without rotating the third lens frame 51 about the lens barrel axis Z0. The third lens frame 51 is biased forward by a third lens frame biasing spring (extension coil spring) 55. The digital camera 200 is provided with a focusing motor 160 having a rotary drive shaft which is threaded to serve as a feed screw, and the rotary drive shaft is screwed through a screw hole formed on an AF nut 54. If the AF nut 54 is moved rearward by a rotation of the rotary drive shaft of the focusing motor 160, the third lens frame 51 is pressed by the AF nut 54 to move rearward. Conversely, if the AF nut 54 is moved forward, the third lens frame 51 follows the AF nut 54 to move forward by the biasing force of the third lens frame biasing spring 55. Due to this structure, the third lens frame 51 can be moved forward and rearward in the optical axis direction.

Figure 4:
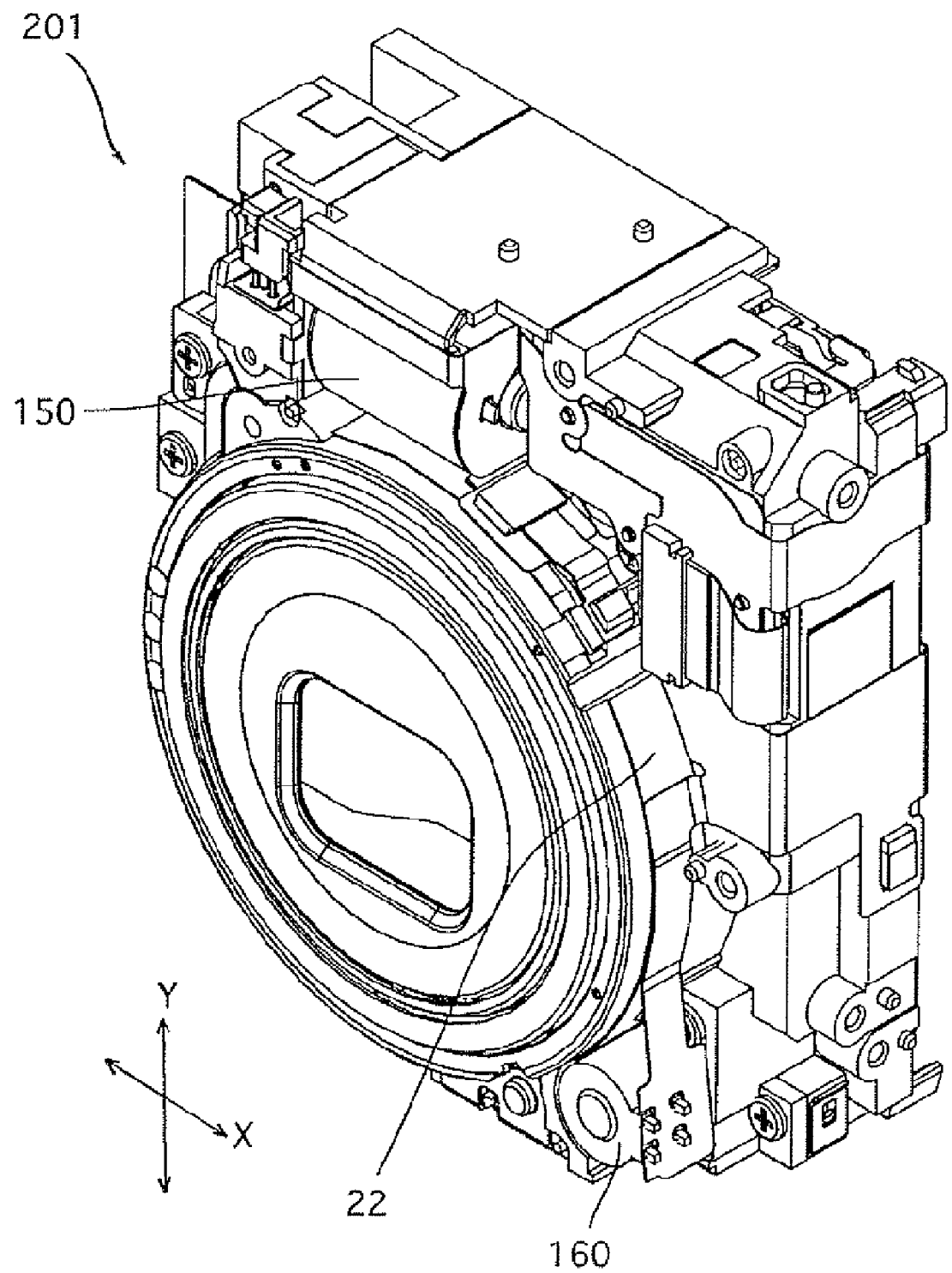
FIG. 4 is a perspective view of the zoom lens of the digital camera shown in FIG. 1 in the fully-retracted state of the zoom lens.
Figure 5:
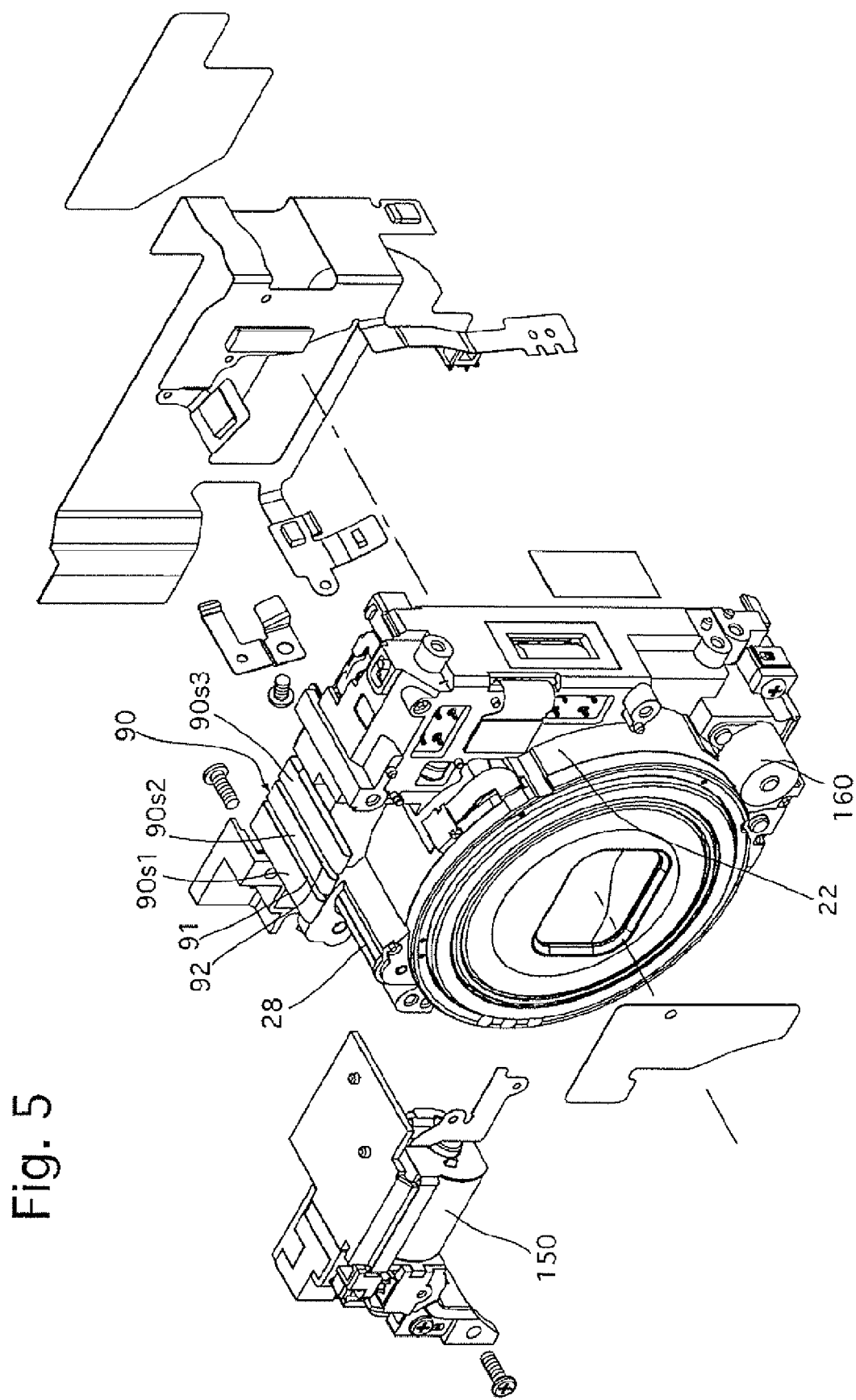
FIG. 5 is an exploded perspective view of the zoom lens shown in FIG. 4 from which a zoom motor and other elements are removed.

As shown in FIG. 4, the digital camera 200 is provided on the stationary barrel 22 with a zoom motor 150 which is supported by the stationary barrel 22. The driving force of the zoom motor 150 is transferred to a zoom gear 28 (see FIGS. 5 and 6) via a reduction gear train (not shown). The zoom gear 28 is rotatably fitted on a zoom gear shaft 29 extending parallel to the photographing optical axis Z1. Front and rear ends of the zoom gear shaft 29 are fixed to the stationary barrel 22 and the stationary holder 23, respectively.

The helicoid ring 18 is positioned inside the stationary barrel 22 and supported thereby. The helicoid ring 18 is rotated by rotation of the zoom gear 28. The helicoid ring 18 is moved forward and rearward in the optical axis direction while being rotated about the lens barrel axis Z0 via a helicoid structure (provided between the helicoid ring 18 and the stationary barrel 22) within a predetermined range in the optical axis direction between the position in the fully-retracted state of the zoom lens 201 shown in FIG. 3 to the position in the state of the zoom lens 201 immediately before the zoom lens 201 is in the ready-to-photograph state thereof at the wide-angle extremity shown by the upper half of the zoom lens 201 in FIG. 2. In a ready-to-photograph state of the zoom lens 201 shown in FIG. 2 (between the wide-angle extremity and the telephoto extremity), the helicoid ring 18 is rotated at a fixed position without moving in the optical axis direction. The first movable barrel 15 is coupled to the helicoid ring 18 to be rotatable together with the helicoid ring 18 about the lens barrel axis Z0 and to be movable together with the helicoid ring 18 in the optical axis direction.

The first linear guide ring 14 is positioned inside the first movable barrel 15 and the helicoid ring 18 and supported thereby. The first linear guide ring 14 is guided linearly in the optical axis direction via linear guide grooves formed on the stationary barrel 22, and is engaged with the first movable barrel 15 and the helicoid ring 18 to be rotatable about the lens barrel axis Z0 relative to the first movable barrel 15 and the helicoid ring 18, and to be movable in the optical axis direction together with the first movable barrel 15 and the helicoid ring 18.

As shown in FIG. 6, the first linear guide ring 14 is provided with a set of three through-slots 14a (only two of which appear in FIG. 6) which radially penetrate the first linear guide ring 14. Each through-slot 14a includes a circumferential slot portion and an inclined lead slot portion which extends obliquely rearward from one end of the circumferential slot portion. The inclined lead slot portion is inclined with respect to the optical axis direction, while the circumferential slot portion extends circumferentially about the lens barrel axis Z0. A set of three followers 11a (only two of which appear in FIG. 7) which project radially outward from an outer peripheral surface of the cam ring 11 are engaged in the set of three through-slots 14a, respectively. The set of three followers 11a are further engaged in a set of three rotation transfer grooves 15a which are formed on an inner peripheral surface of the first movable barrel 15 and extend parallel to the photographing optical axis Z1 so that the cam ring 11 rotates with the first movable barrel 15. When the set of three followers 11a are engaged in the lead slot portions of the set of three through-slots 14a, respectively, the cam ring 11 is moved forward and rearward in the optical axis direction while being rotated about the lens barrel axis Z0 and guided by the set of three through-slots 14a. On the other hand, when the set of three followers 11a are engaged in the circumferential slot portions of the set of three through-slots 14a, respectively, the cam ring 11 is rotated at a fixed position without moving in the optical axis direction. Similar to the helicoid ring 18, the cam ring 11 is moved forward and rearward in the optical axis direction while being rotated about the lens barrel axis Z0 within a predetermined range in the optical axis direction between the position in the fully-retracted state of the zoom lens 201 shown in FIG. 3 to the position in the state of the zoom lens 201 immediately before the zoom lens 201 enters the ready-to-photograph state thereof at the wide-angle extremity (shown by the upper half of the zoom lens 201 in FIG. 2), and the cam ring 11 is rotated at a fixed position without moving in the optical axis direction in a ready-to-photograph state of the zoom lens 201 shown in FIG. 2 (between the wide-angle extremity and the telephoto extremity).

The first linear guide ring 14 guides the second linear guide ring 10 and the second movable ring 13 linearly in the optical axis direction by linear guide grooves which are formed on an inner peripheral surface of the first linear guide ring 14 to extend parallel to the photographing optical axis Z1. The second linear guide ring 10 guides a second lens group moving frame 8, which indirectly supports the second lens group LG2, linearly in the optical axis direction, while the second movable barrel 13 guides the third movable barrel 12, which indirectly supports the first lens group LG1, linearly in the optical axis direction. Each of the second linear guide ring 10 and the second movable barrel 13 is supported by the cam ring 11 to be rotatable relative to the cam ring 11 about the lens barrel axis Z0 and to be movable together with the cam ring 11 in the optical axis direction.

The cam ring 11 is provided on an inner peripheral surface thereof with a plurality of inner cam grooves 11b for moving the second lens group LG2, and the second lens group moving frame 8 is provided on an outer peripheral surface thereof with a plurality of cam followers 8a which are engaged in the plurality of inner cam grooves 11b, respectively. Since the second lens group moving frame 8 is guided linearly in the optical axis direction without rotating via the second linear guide ring 10, a rotation of the cam ring 11 causes the second lens group moving frame 8 to move in the optical axis direction in a predetermined moving manner in accordance with contours of the plurality of inner cam grooves 11b.

As shown in FIG. 7, the zoom lens 201 is provided inside the second lens group moving frame 8 with a second lens frame 6 which supports and holds the second lens group LG2. The second lens frame 6 is supported by the second lens group moving frame 8 to be rotatable (swingable) about a pivot shaft 33. The pivot shaft 33 extends parallel to the photographing optical axis Z1. The second lens frame 6 is swingable about the pivot shaft 33 between a photographing position (shown in FIG. 2) where the second lens group LG2 is positioned on the photographing optical axis Z1 and a radially retracted position (shown in FIG. 3) where the optical axis of the second lens group LG2 is retracted away from the photographing optical axis Z1 to be positioned above the photographing optical axis Z1. The second lens frame 6 is biased to rotate in a direction toward the aforementioned photographing position of the second lens frame 6 by a torsion spring 39. The stationary holder 23 is provided with a position-control cam bar (second lens frame removing device) 23a see FIGS. 6 and 8) which projects forward from the stationary holder 23 to be engageable with the second lens frame 6 so that the position-control cam bar 23a comes into pressing contact with the second lens frame 6 to rotate the second lens frame 6 to the radially retracted position thereof against the biasing force of the torsion spring 39 when the second lens group moving frame 8 moves rearward in a retracting direction to approach the stationary holder 23.

The second movable barrel 13, which is guided linearly in the optical axis direction without rotating by the second linear guide ring 10, guides the third movable barrel 12 linearly in the optical axis direction. The third movable barrel 12 is provided on an inner peripheral surface thereof with a set of three cam followers 31 (see FIG. 7) which project radially inwards, and the cam ring 11 is provided on an outer peripheral surface thereof with a set of three outer cam grooves 11c (cam grooves for moving the first lens group LG1; only two of them appear in FIG. 7) in which the set of three cam followers 31 are slidably engaged, respectively. The zoom lens 201 is provided inside the third movable barrel 12 with a first lens frame 1 which is supported by the third movable barrel 12 via a first lens group adjustment ring 2.

The zoom lens 201 is provided between the first and second lens groups LG1 and LG2 with a shutter unit 100 including the shutter S and the adjustable diaphragm A. The shutter unit 100 is positioned inside the second lens group moving frame 8 and fixed thereto.

Operations of the zoom lens 201 that has the above described structure will be discussed hereinafter. In the state shown in FIG. 3, in which the zoom lens 201 is in the fully-retracted state, the zoom lens 201 is fully accommodated in the camera body 202. Upon a main switch 101 (see FIG. 25)

provided on an outer surface of the camera body 202 being turned ON in the fully-retracted state of the zoom lens 201 shown in FIG. 3, the zoom motor 150 is driven to rotate in a lens barrel advancing direction by control of a control circuit 102 (see FIG. 25) provided in the camera body 202. This rotation of the zoom motor 150 rotates the zoom gear 28. The rotation of the zoom gear 28 causes a combination of the first movable barrel 15 and the helicoid ring 18 to move forward while rotating about the lens barrel axis Z0 due to the aforementioned helicoid structure, and further causes the first linear guide ring 14 to move forward linearly together with the first movable barrel 15 and the helicoid ring 18. At this time, the cam ring 11 which rotates by rotation of the first movable barrel 15 moves forward in the optical axis direction by an amount of movement corresponding to the sum of the amount of the forward movement of the first linear guide ring 14 and the amount of the forward movement of the cam ring 11 by a leading structure between the first linear guide ring 14 and the cam ring 11, i.e., by the engagement of the inclined lead slot portions of the set of three through-slots 14a and the set of three followers 11a of the cam ring 11, respectively. Once the helicoid ring 18 and the cam ring 11 advance to respective predetermined points thereof, the functions of a rotating/advancing mechanism (the aforementioned helicoid structure) between the helicoid ring 18 and the stationary barrel 22) and another rotating/advancing mechanism (the aforementioned leading structure) between the cam ring 11 and the first linear guide ring 14 are canceled, so that each of the helicoid ring 18 and the cam ring 11 rotates about the lens barrel axis Z0 without moving in the optical axis direction.

A rotation of the cam ring 11 causes the second lens group moving frame 8, which is positioned inside the cam ring 11 and guided linearly in the optical axis direction via the second linear guide ring 10, to move in the optical axis direction with respect to the cam ring 11 in a predetermined moving manner due to the engagement of the set of three cam followers 8a with the set of three inner cam grooves 11b, respectively. In the state shown in FIG. 3, in which the zoom lens 201 is in the fully-retracted state, the second lens frame 6, which is positioned inside the second lens group moving frame 8, is held in the radially retracted position off the photographing optical axis Z1 by the action of the position-control cam bar 23a, which projects forward from the stationary holder 23. During the course of movement of the second lens group moving frame 8 from the retracted position to a position in the zooming range, the second lens frame 6 is disengaged from the position-control cam bar 23a to rotate about the pivot shaft 33 from the radially retracted position to the photographing position shown in FIG. 2, where the optical axis of the second lens group LG2 coincides with the photographing optical axis Z1, by the spring force of the torsion spring 39. Thereafter, the second lens frame 6 remains held in the photographing position until the zoom lens 201 is retracted into the camera body 201.

In addition, a rotation of the cam ring 11 causes the third movable barrel 12, which is positioned around the cam ring 11 and guided linearly in the optical axis direction via the second movable barrel 13, to move in the optical axis direction relative to the cam ring 11 in a predetermined moving manner due to the engagement of the set of three cam followers 31 with the set of three outer cam grooves 11c of the cam ring 11, respectively.

Accordingly, an axial position of the first lens group LG1 relative to a picture plane (imaging surface/light receiving surface of the CCD image sensor 60) when the first lens group LG1 is moved forward from the fully-retracted position is determined by the sum of the amount of forward movement of the cam ring 11 relative to the stationary barrel 22 and the amount of movement of the third external barrel 12 relative to the cam ring 11, while an axial position of the second lens group LG2 relative to the picture plane when the second lens group LG2 is moved forward from the fully-retracted position is determined by the sum of the amount of forward movement of the cam ring 11 relative to the stationary barrel 22 and the amount of movement of the second lens group moving frame 8 relative to the cam ring 11. A zooming operation is carried out by moving the first and second lens groups LG1 and LG2 on the photographing optical axis Z1 while changing the air distance therebetween. When the zoom lens 201 is driven to advance from the fully-retracted position shown in FIG. 3, the zoom lens 201 firstly moves to a position shown above the photographing lens axis Z1 in FIG. 2 in which the zoom lens 201 is at the wide-angle extremity. Subsequently, the zoom lens 201 moves a position state shown below the photographing lens axis Z1 in FIG. 2 in which the zoom lens 201 is at the telephoto extremity by a further rotation of the zoom motor 150 in a lens barrel advancing direction thereof. As can be seen from FIG. 2, the space between the first and second lens groups LG1 and LG2 when the zoom lens 201 is at the wide-angle extremity is greater than when the zoom lens 201 is at the telephoto extremity. When the zoom lens 201 is at the telephoto extremity as shown below the photographing lens axis Z1 in FIG. 2, the first and second lens groups LG1 and LG2 have moved to approach each other to have some space therebetween which is smaller than the space in the zoom lens 201 at the wide-angle extremity. This variation of the air distance between the first and second lens groups LG1 and LG2 for the zooming operation is achieved by contours of the plurality of inner cam grooves 11b (for moving the second lens group LG2) and the set of three outer cam grooves 11c (for moving the first lens group LG1) of the cam ring 11. In the zooming range between the wide-angle extremity and the telephoto extremity, the cam ring 11, the first movable barrel 15 and the helicoid ring 18 rotate at their respective axial fixed positions, i.e., without moving in the optical axis direction.

In a ready-to-photograph state of the zoom lens 201 between the wide-angle extremity and the telephoto extremity, a focusing operation is carried out by moving the third lens group LG3 (the third lens frame 51) along the photographing optical axis Z1 by driving the AF motor 160 in accordance with object distance information obtained by a distance measuring device of the digital camera 200.

Upon the main switch 101 being turned OFF, the zoom motor 150 is driven to rotate in a lens barrel retracting direction so that the zoom lens 201 operates in the reverse manner to the above described advancing operation to fully retract the zoom lens 201 into the camera body 202 as shown in FIG. 3. During the course of this retracting movement of the zoom lens 201, the second lens frame 6 rotates about the pivot shaft 33 to the radially retracted position by the position-control cam bar 23a while moving rearward together with the second lens group moving frame 8. When the zoom lens 201 is fully retracted into the camera body 202, the second lens group LG2 is retracted into the space radially outside the space in which the third lens group LG3, the low-pass filter LG4 and the CCD image sensor 60 are retracted as shown in FIG. 3, i.e., the second lens group LG2 is radially retracted into an axial range substantially identical to an axial range in the optical axis direction in which the third lens group LG3, the low-pass filter LG4 and the CCD image sensor 60 are positioned. This structure of the digital camera 200 for retracting the second lens group LG2 in this manner reduces the length of the zoom lens 201 when the zoom lens 201 is fully retracted, thus making it possible to reduce the thickness of the camera body 202 in the optical axis direction, i.e., in the horizontal direction as viewed in FIG. 3.

Figure 8:
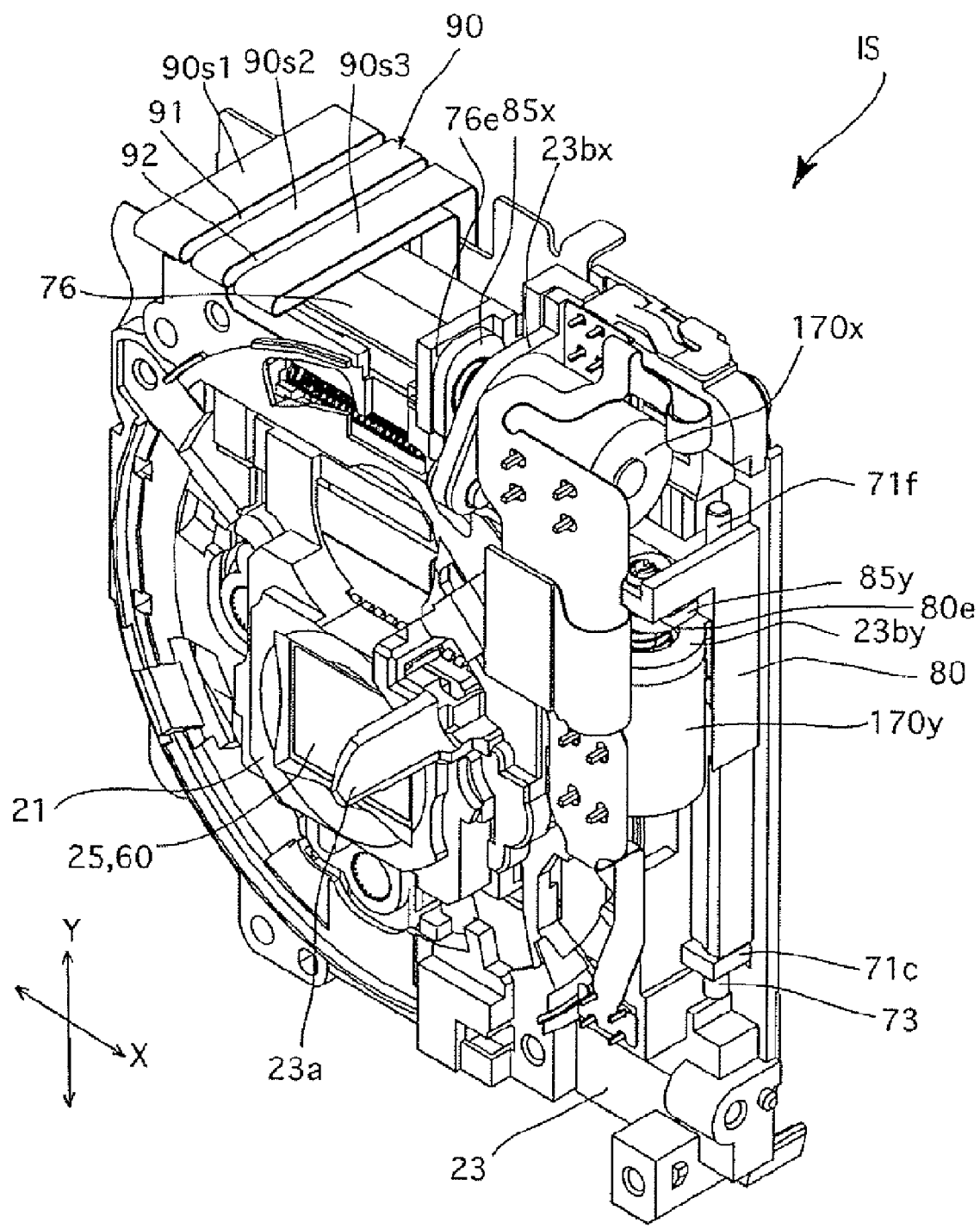
FIG. 8 is a front perspective view of an image stabilizing unit (image stabilizing mechanism) shown in FIG. 6.
Figure 9:
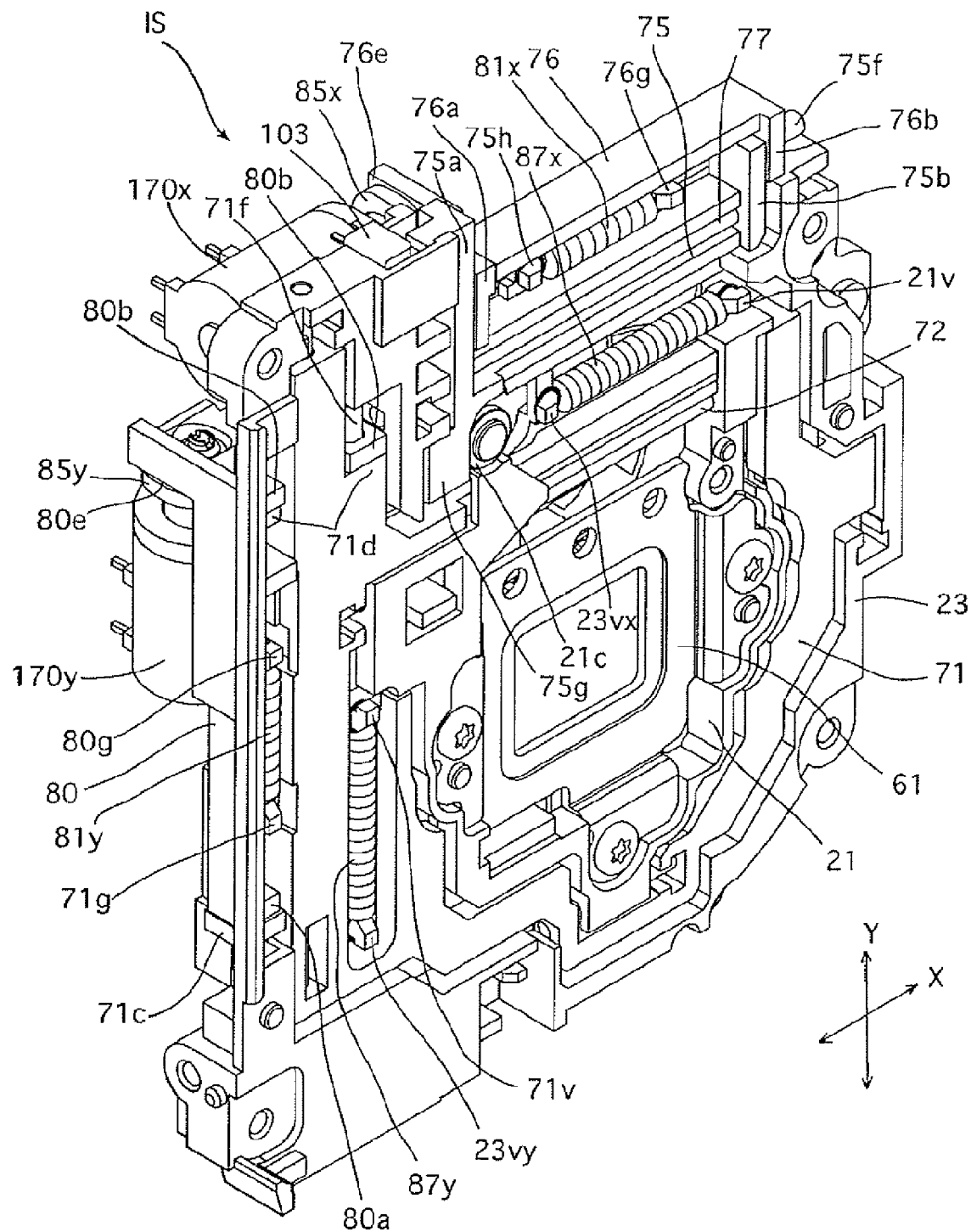
FIG. 9 is a rear perspective view of the image stabilizing unit shown in FIG. 6.
Figure 10:
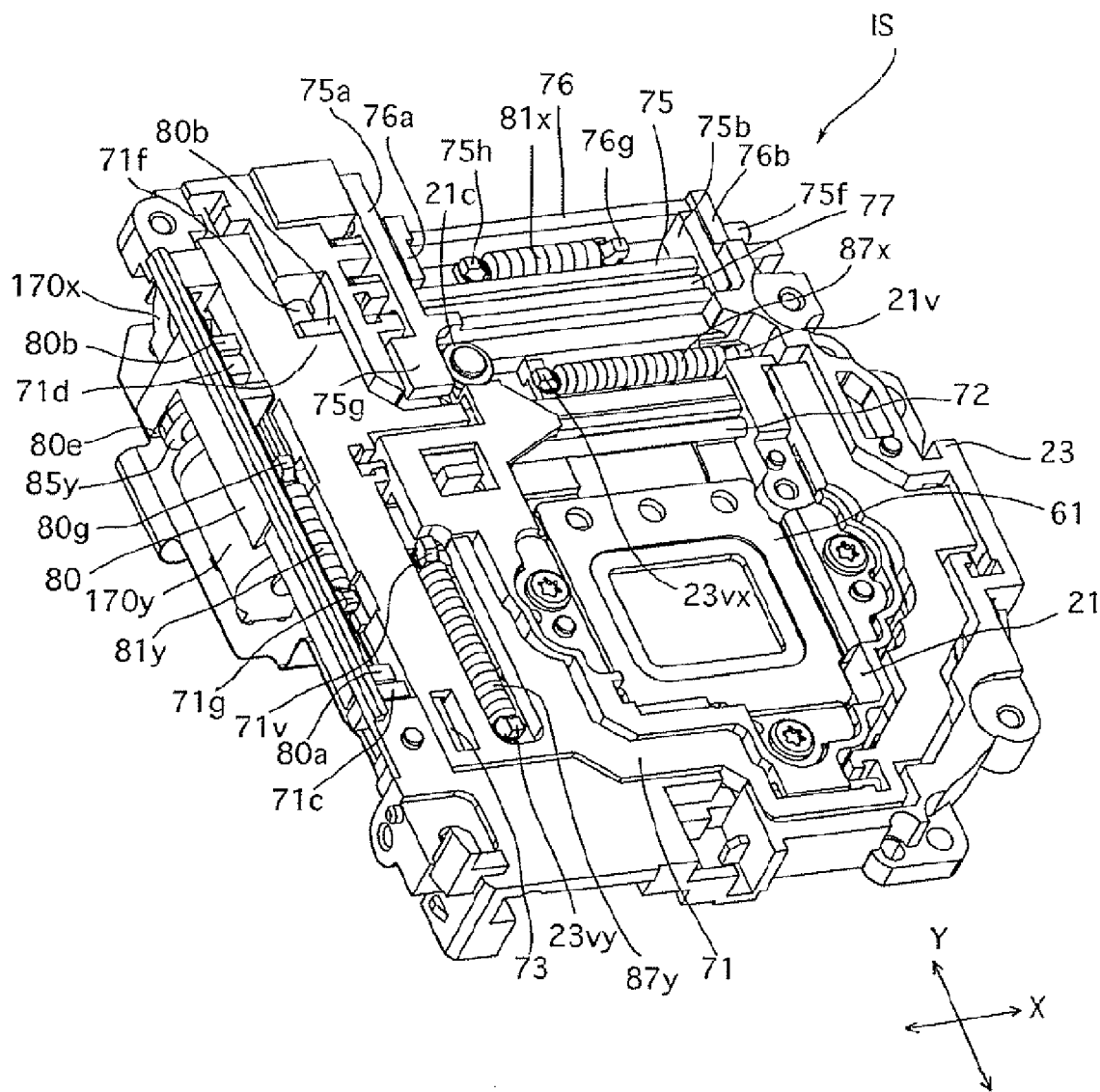
FIG. 10 is a rear perspective view of the image stabilizing unit shown in FIGS. 8 and 9, viewed from an angle different from the angle of FIG. 9.
Figure 11:
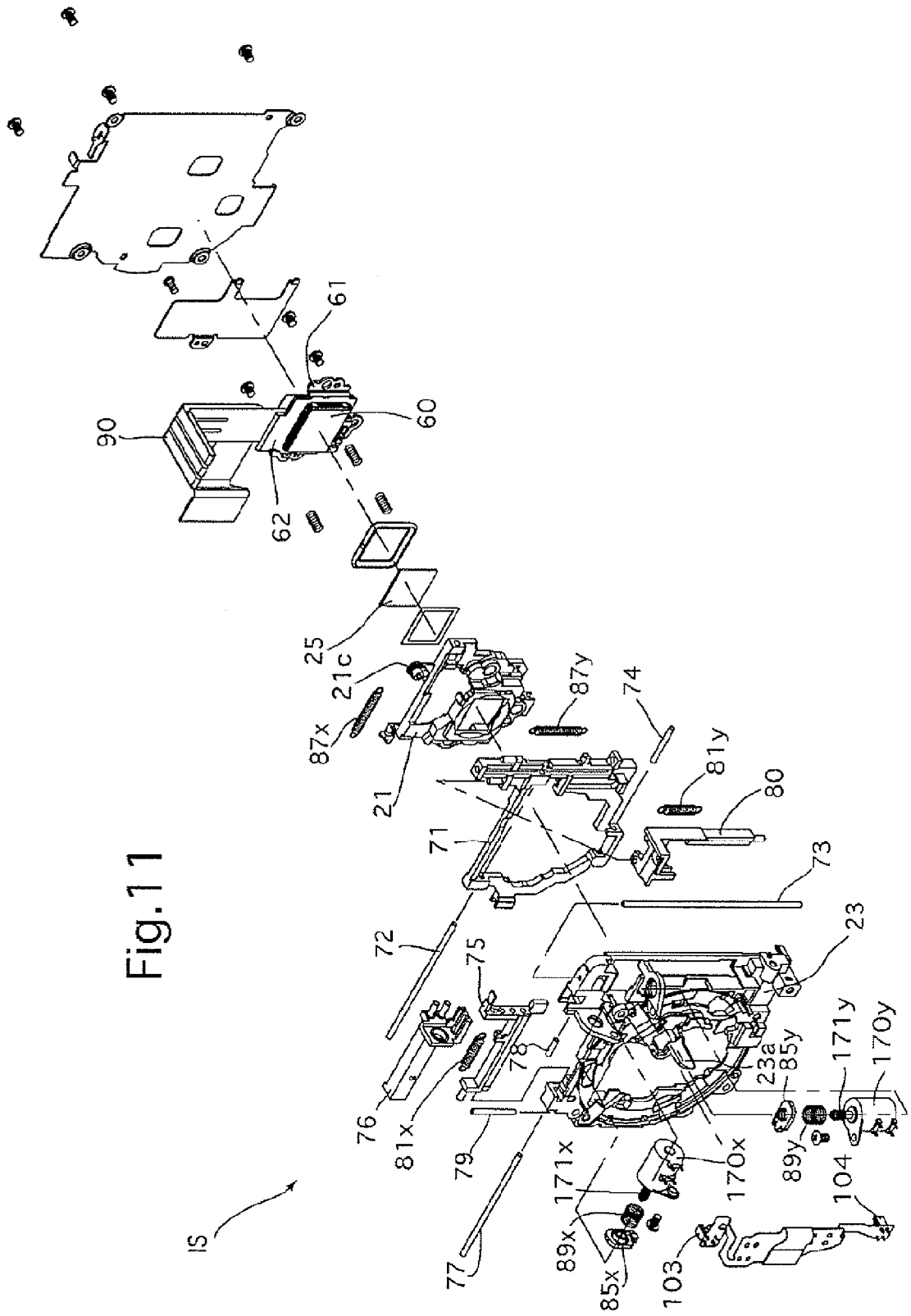
FIG. 11 is an exploded perspective view of the image stabilizing unit.
Figure 25:
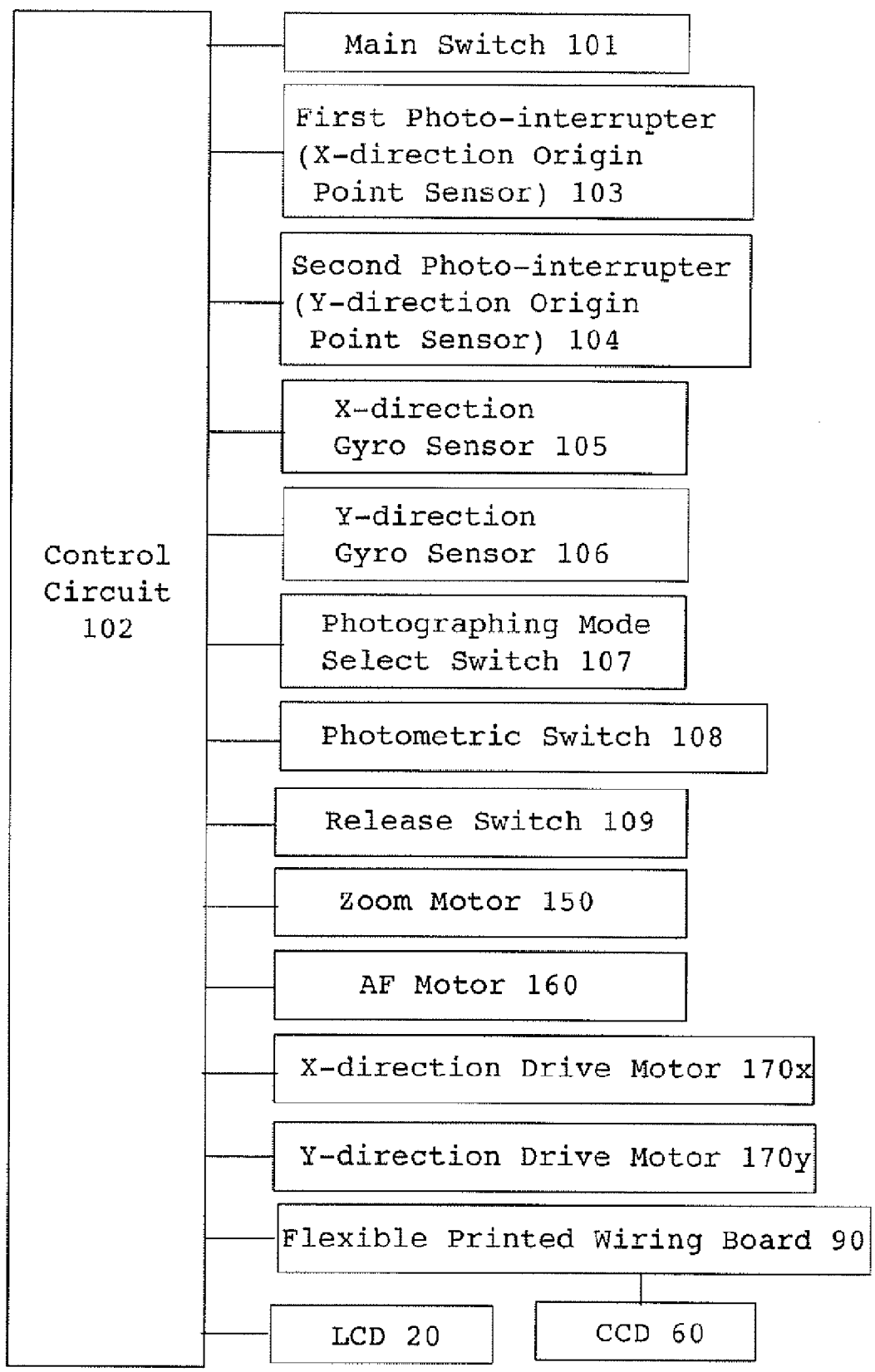
FIG. 25 is a block diagram illustrating a configuration of electrical circuits of the digital camera shown in FIGS. 1 through 3.

The digital camera 200 is provided with an image stabilizer (optical image stabilizer). This image stabilizer moves the CCD image sensor 60 in a plane orthogonal to the photographing optical axis 21 to counteract image shake of an object image captured by the CCD image sensor 60 in accordance with the direction and the magnitude of vibration (hand shake) applied to the digital camera 200. This control is performed by the control circuit 102 (FIG. 25). FIGS. 8 through 10 show an image stabilizing unit IS including the CCD image sensor 60. FIG. 11 is an exploded perspective view of the entire image stabilizing unit IS and FIGS. 12 through 18 are perspective views or exploded perspective views of various portions of the image stabilizing unit IS.

The stationary holder 23 is provided with a pair of Y-direction guide rods 73 and 79 which extend in the Y-direction (the vertical direction of the digital camera 200). The Y-direction moving stage 71 is provided with a guide hole 71a and a guide groove 71b (see FIG. 17) in which the pair of Y-direction guide rods 73 and 79 are engaged so that the Y-direction moving stage 71 is supported by the pair of Y-direction guide rods 73 and 79 to be freely slidable thereon, respectively. A pair of X-direction guide rods 72 and 74 are fixed to the Y-direction moving stage 71 to extend in the X-direction (the horizontal direction of the digital camera 200) that is perpendicular to the Y-direction. The X-direction moving stage 21 is provided with a guide hole 21a and a guide groove 21b (see FIGS. 13 and 14) in which the pair of X-direction guide rods 72 and 74 are engaged so that the X-direction moving stage 21 is freely slidable thereon, respectively. Accordingly, the CCD image sensor 60 is supported by the stationary holder 23 via the Y-direction moving stage 71 and the X-direction moving stage 21 to be movable in two axial directions orthogonal to each other in a plane orthogonal to the photographing optical axis Z1. The range of movement of the X-direction moving stage 21 is defined by inner peripheral surfaces of the Y-direction moving stage 71, while the range of movement of the Y-direction moving stage 71 is defined by inner peripheral surfaces of the stationary holder 23.

The image stabilizing unit IS is provided with an X-direction stage biasing spring 87x which is extended and installed between a spring hook 21v formed on the X-direction moving stage 21 and a spring hook 23vx formed on the stationary holder 23. The X-direction stage biasing spring 87x is an extension coil spring and biases the X-direction moving stage 21 rightward as viewed from the front of the zoom lens 201 (leftward as viewed from the rear of the zoom lens 201). The image stabilizing unit IS is provided with a Y-direction stage biasing spring 87y which is extended and installed between a spring hook 71v formed on the Y-direction moving stage 71 and a spring hook 23vy formed on the stationary holder 23. The Y-direction stage biasing spring 87y is an extension coil spring and biases the Y-direction moving stage 71 downward.

Figure 17:
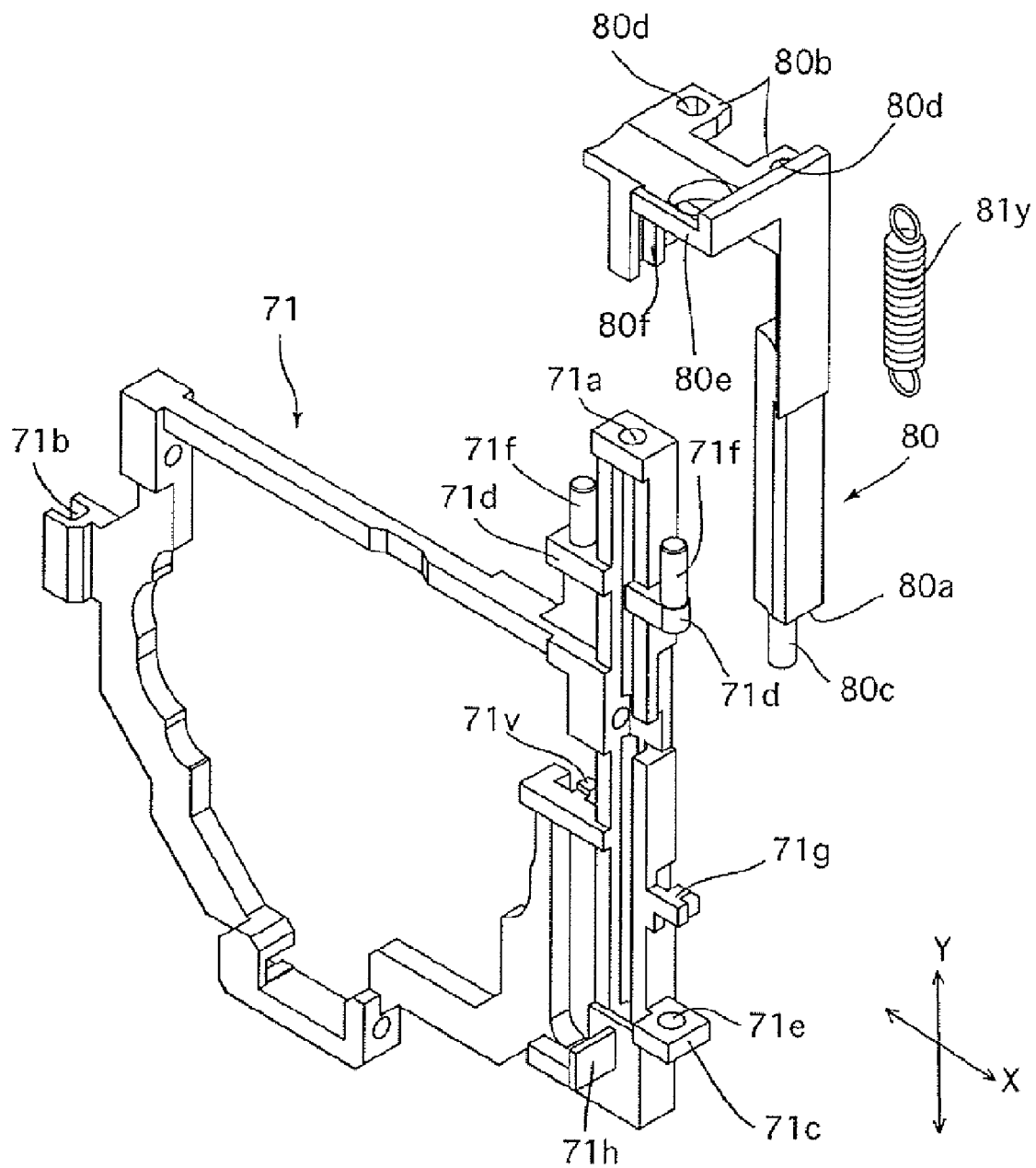
FIG. 17 is an exploded perspective view of a Y-direction moving member, a Y-direction moving stage and an associated extension joining spring of the image stabilizing unit.
Figure 18:
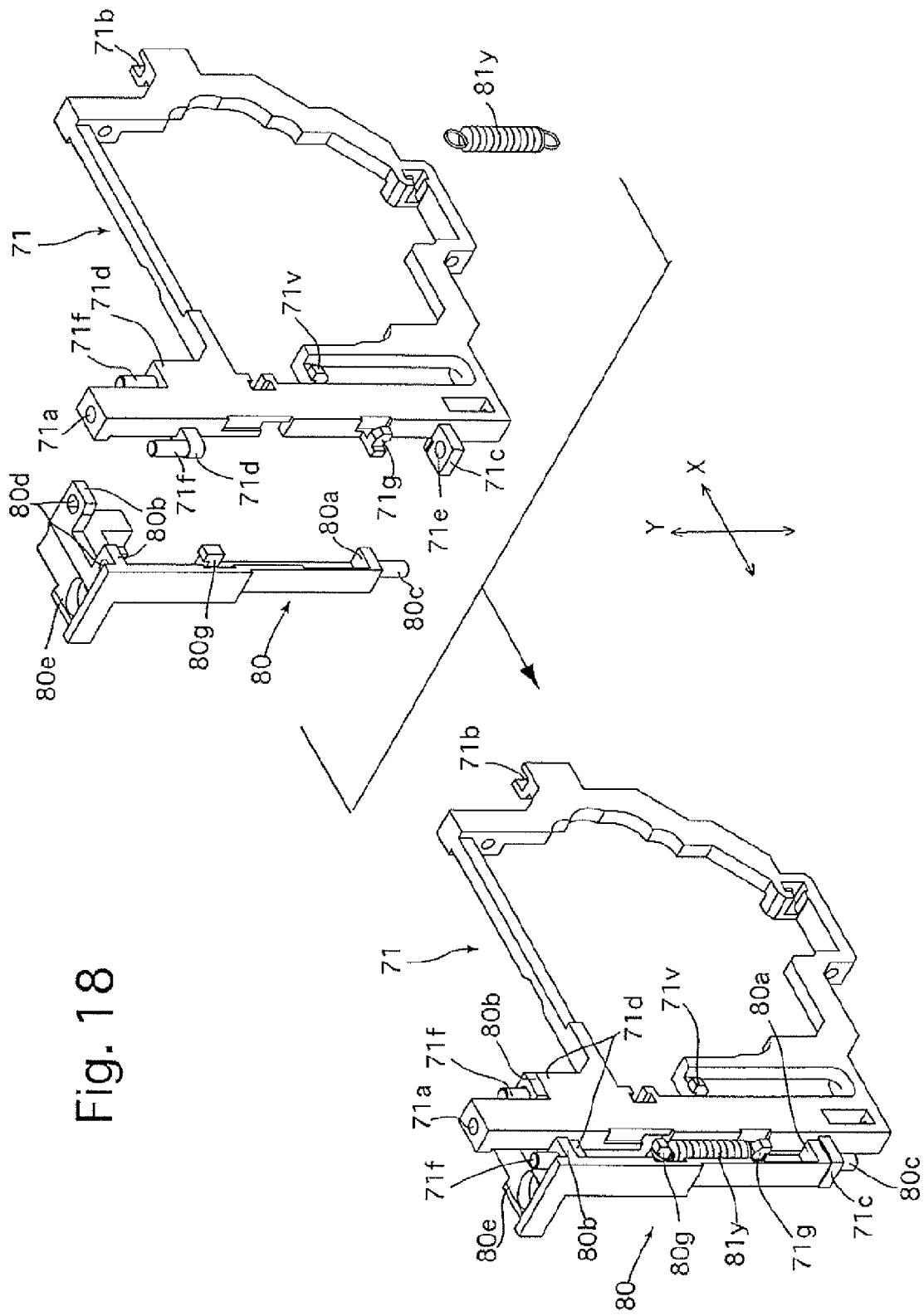
FIG. 18 is a rear perspective view of the Y-direction moving member, the Y-direction moving stage and the associated extension joining spring that are shown in FIG. 17, showing an exploded state and an assembled state thereof.

As shown in FIGS. 17 and 18, the image stabilizing unit IS is provided on one side of the Y-direction moving stage 71 with a Y-direction moving member 80 which is supported by the Y-direction moving stage 71. The Y-direction moving member 80 is elongated in the Y-direction and provided in the vicinity of upper and lower ends of the Y-direction moving member 80 with a movement limit lug 80a and a movement limit lug 80b, respectively. The Y-direction moving member 80 is provided at a lower end thereof with a guide pin 80c which extends downward from the movement limit lug 80a. The movement limit lug 80b is provided with a pair of guide holes 80d. The Y-direction moving member 80 is further provided in the vicinity of the pair of guide holes 80d with a nut contacting portion 80e and a linear groove 80f (see FIG. 17), and is further provided, on a vertically straight portion of the Y-direction moving member 80 between the movement limit lug 80a and the movement limit lug 80b, with a spring hook 80g (see FIG. 17). The linear groove 80f is elongated in the Y-direction.

The Y-direction moving stage 71 is provided with a movement limit lug 71c and a movement limit lug 71d which face the movement limit lug 80a and the movement limit lug 80b of the Y-direction moving member 80, respectively. The movement limit lug 71c is provided with a guide hole 71e in which the guide pin 80c is slidably engaged, while the movement limit lug 71d is provided with a pair of guide pins 71f which extend upward to be slidably engaged in the pair of guide holes 80d, respectively. The Y-direction moving stage 71 is provided on a vertically straight portion thereof between the movement limit lug 71c and a movement limit lug 71d, with a spring hook 71g.

The Y-direction moving stage 71 and the Y-direction moving member 80 are guided to be movable relative to each other in the Y-direction by the engagement of the guide hole 71e with the guide pin 80c and the engagement of the pair of guide pins 71f with the pair of guide holes 80d. The image stabilizing unit IS is provided with an extension joining spring 81y which is extended and installed between the spring hook 71g of the Y-direction moving stage 71 and the spring hook 80g of the Y-direction moving member 80. The extension joining spring 81y biases the Y-direction moving stage 71 and the Y-direction moving member 80 in opposite directions to bring the movement limit lug 80a the movement limit lug 71c into contact with each other and to bring the movement limit lug 80b and the movement limit lug 71d into contact with each other, i.e., in opposite directions to move the Y-direction moving stage 71 and the Y-direction moving member 80 upward and downward, respectively.

Figure 15:
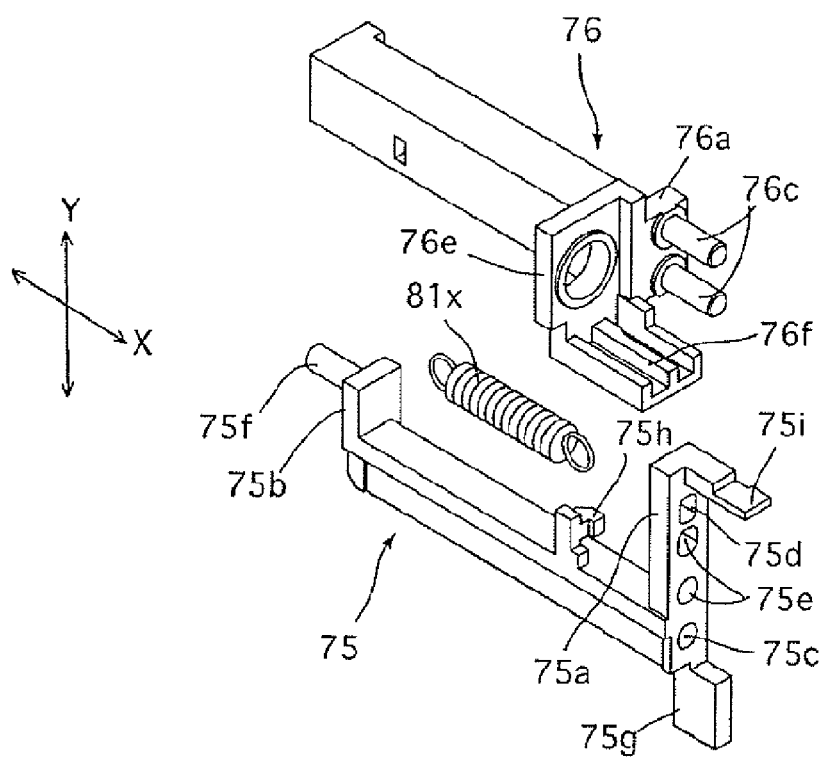
FIG. 15 is a front perspective view of a first X-direction moving member, a second X-direction moving member and an associated extension joining spring of the image stabilizing unit, showing an exploded state thereof.
Figure 16:
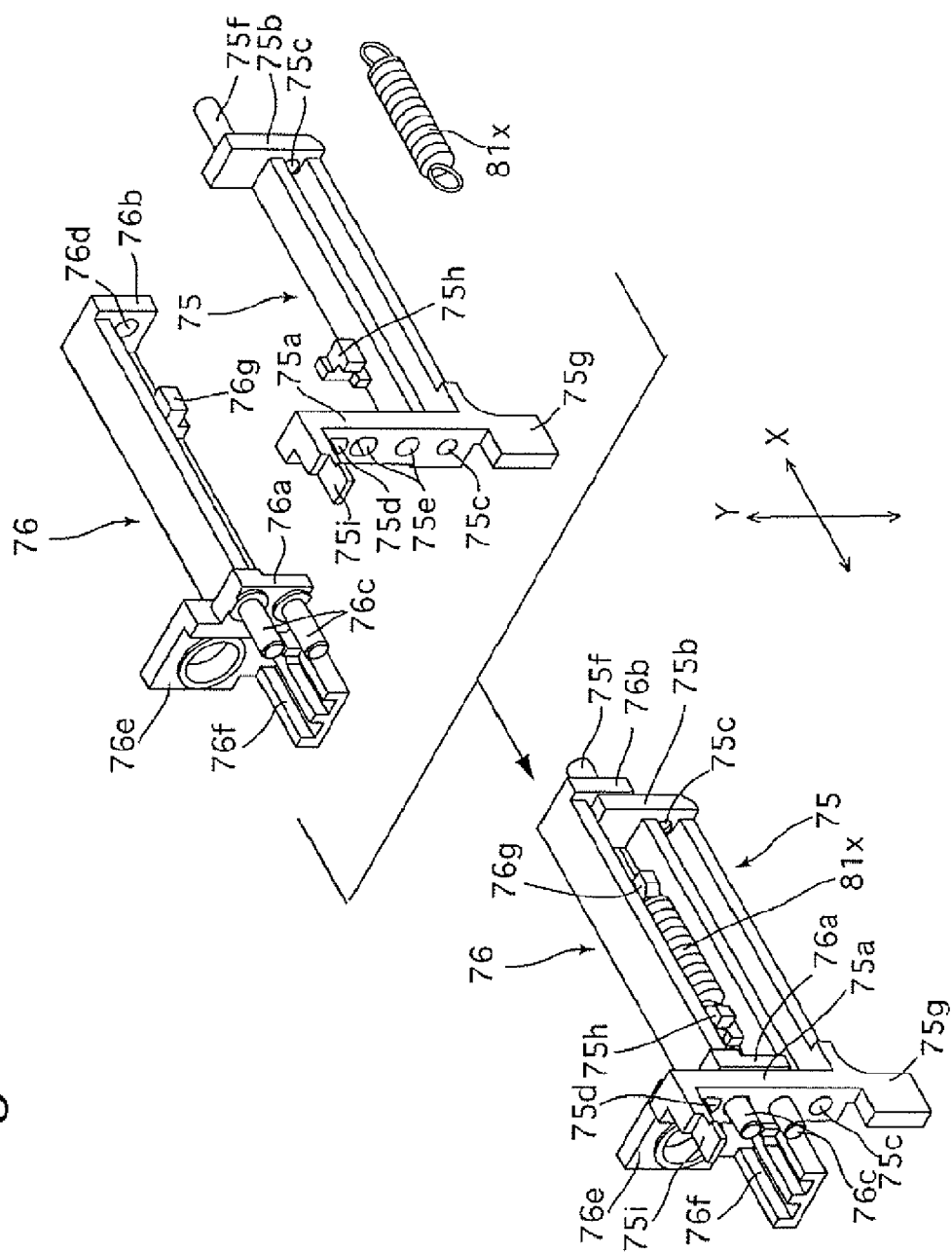
FIG. 16 is a rear perspective view of the first X-direction moving member, the second X-direction moving member and the associated extension joining spring that are shown in FIG. 15, showing an exploded state and an assembled state thereof.

Another pair of X-direction guide rods 77 and 78 that are different from the pair of X-direction guide rods 72 and 74 are fixed to the stationary holder 23 to extend in the X-direction. The image stabilizing unit IS is provided with a first X-direction moving member 75 which is supported by the stationary holder 23 via the pair of X-direction guide rods 77 and 78 to be freely slidable thereon. As shown in FIGS. 15 and 16, the first X-direction moving member 75 is elongated in the X-direction, and is provided, in the vicinity of opposite ends of the first X-direction moving member 75 in the X-direction, with a movement limit lug 75a and a movement limit lug 75b, respectively. A pair of guide holes 75c in which the X-direction guide rod 77 is inserted are formed on the movement limit lugs 75a and 75b, respectively, to be aligned in the X-direction. A guide hole 75d in which the X-direction guide rod 78 is inserted is formed on the movement limit lug 75a. No guide hole corresponding to the guide hole 75d is formed on the movement limit lug 75b. The movement limit lug 75a is provided between the associated guide hole 75c and the guide hole 75d with a pair of guide holes 75e. The movement limit lug 75b is provided, above the associated guide hole 75c in the Y-direction (see FIG. 16), with a guide pin 75f which extends in the X-direction in a direction away from the movement limit lug 75a. The first X-direction moving member 75 is further provided at the bottom of the movement limit lug 75a with a linkage projection 75g, and is further provided, on a horizontally straight portion of the first X-direction moving member 75 between the movement limit lug 75a and a movement limit lug 75b, with a spring hook 75h.

The image stabilizing unit IS is provided on the first X-direction moving member 75 with a second X-direction moving member 76. The second X-direction moving member 76 is provided with a movement limit lug 76a and a movement limit lug 76b which are separate from each other in the X-direction. The movement limit lug 76a is provided with a pair of guide pins 76c which extend in the X-direction to be slidably engaged in the pair of guide holes 75e of the first X-direction moving member 75, respectively, and the movement limit lug 76b is provided with a guide hole 76d in which the guide pin 75f of the first X-direction moving member 75 is slidably engaged. The second X-direction moving member 76 is further provided in the vicinity of the movement limit lug 76a with a nut contacting portion 76e and a linear groove 76f (see FIG. 16), and is further provided, on a horizontally straight portion of the second X-direction moving member 76 between the movement limit lug 76a and the movement limit lug 76b, with a spring hook 76g. The linear groove 76f is elongated in the X-direction.

The first X-direction moving member 75 and the second X-direction moving member 76 are guided to be movable relative to each other in the X-direction by the engagement of the pair of guide pins 76c with the pair of guide holes 75e and the engagement of the guide pin 75f with the guide hole 76d. The image stabilizing unit IS is provided with an extension joining spring 81x which is extended and installed between the spring hook 75h of the first X-direction moving member 75 and the spring hook 76g of the second X-direction moving member 76. The extension joining spring 81x biases the first X-direction moving member 75 and the second X-direction moving member 76 in opposite directions to bring the movement limit lug 75a and the movement limit lug 76a into contact with each other and to bring the movement limit lug 75b and the movement limit lug 76b into contact with each other.

The linkage projection 75g of the first X-direction moving member 75 is in contact with a transfer roller 21c (see FIGS. 13 and 14) mounted to the X-direction moving stage 21 so that a moving force in the X-direction is transferred from the first X-direction moving member 75 to the X-direction moving stage 21 via the contacting engagement between the linkage projection 75g and the transfer roller 21c. The transfer roller 21c is supported by a rotation pin parallel to the photographing optical axis 21 so as to be freely rotatable on the rotation pin. When the X-direction moving stage 21 moves with the Y-direction moving stage 71 in the Y-direction, the transfer roller 21c rolls on a contacting surface of the linkage projection 75g. This contacting surface of the linkage projection 75g is a flat surface elongated in the Y-direction, and accordingly, allowing the transfer roller 21c to roll on the contacting surface of the linkage projection 75g makes it possible for the X-direction moving stage 21 to move in the Y-direction without exerting any driving force in the Y-direction to the first X-direction moving member 75.

Figure 12:
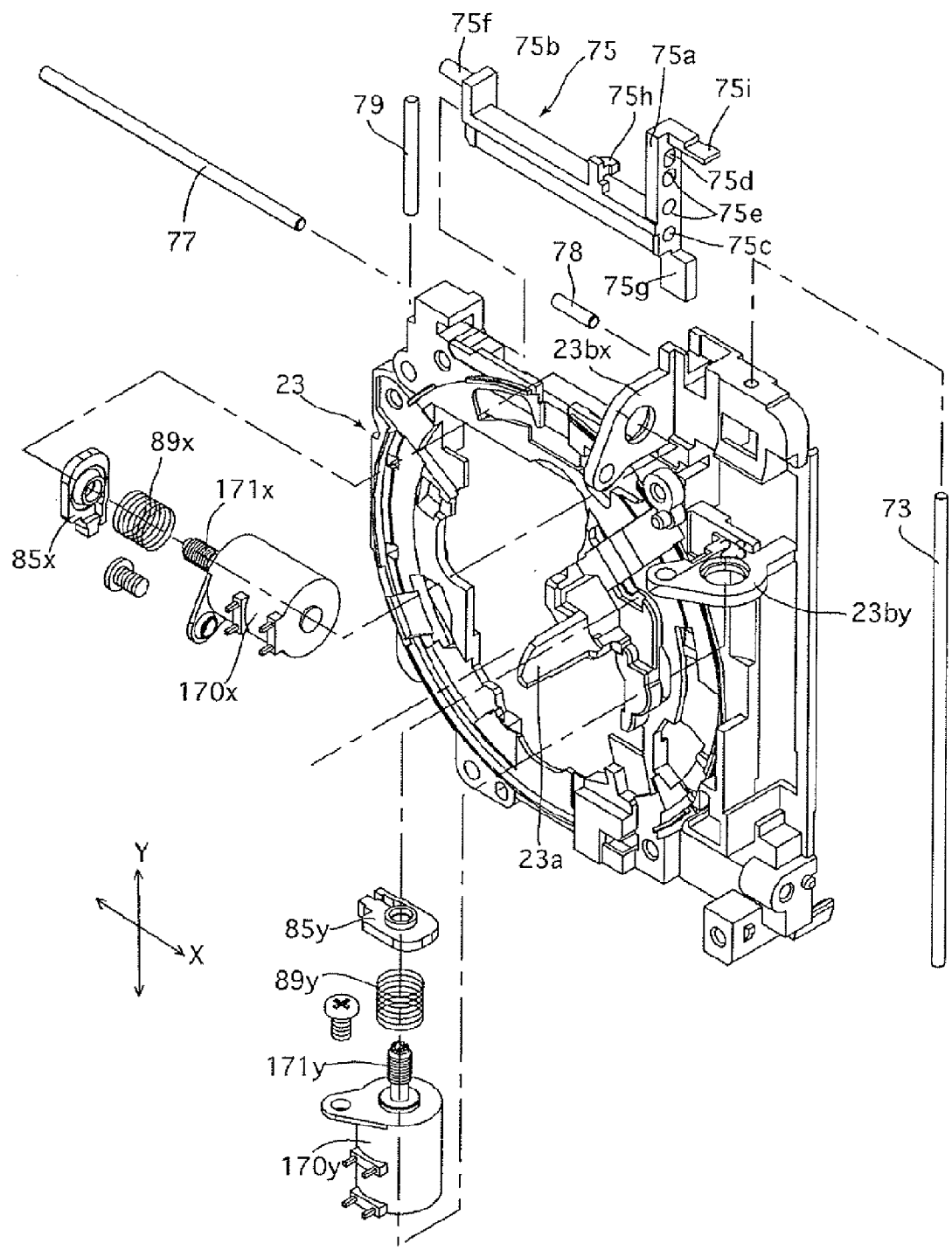
FIG. 12 is an exploded perspective view of a portion of the image stabilizing unit in the vicinity of a stationary holder thereof.

As shown in FIG. 12, the image stabilizing unit IS is provided with an X-direction drive motor 170x serving as a drive source for driving the CCD image sensor 60 in the X-direction and a Y-direction drive motor 170y serving as a drive source for driving the CCD image sensor 60 in the Y-direction. The X-direction drive motor 170x and the Y-direction drive motor 170y are fixed to a motor bracket 23bx and a motor bracket 23by, respectively, which are integrally formed on the stationary holder 23. Each of the X-direction drive motor 170x and the Y-direction drive motor 171y is a stepping motor. A drive shaft (rotary shaft) of the X-direction drive motor 170x is threaded to serve as a feed screw 171x, and a drive shaft (rotary shaft) of the Y-direction drive motor 170y is threaded to serve as a feed screw 171y. The feed screw 171x is screwed into a female screw hole of an X-direction driven nut member 85x and the feed screw 171y is screwed into a female screw hole of a Y-direction driven nut member 85y. The X-direction driven nut member 85x is guided linearly in the X-direction by the linear groove 76f, and is in contact with the nut contacting portion 76e. The Y-direction driven nut member 85y is guided linearly in the Y-direction by the linear groove 80f, and is in contact with the nut contacting portion 80e. The X-direction driven nut member 85x can be screw-disengaged from either end of the feed screw 171x, and the Y-direction driven nut member 85y can be screw-disengaged from either end of the feed screw 171y.

A nut-member biasing spring 89x is positioned between the X-direction driven nut member 85x and the X-direction drive motor 170x, and a nut-member biasing spring 89y is positioned between the Y-direction driven nut member 85x and the X-direction drive motor 170y. Each of the nut-member biasing springs 89x and 89y is a compression coil spring which is loosely fitted on the associated feed screw 171x and 171y, respectively, in a compressed state. The nut-member biasing spring 89x biases the X-direction driven nut member 85x in a direction to bring the X-direction driven nut member 85x back into screw engagement with the X-direction drive motor 170x in the case where the X-direction driven nut member 85x is disengaged from the X-direction drive motor 170x toward the X-direction drive motor 170x side. Likewise, the nut-member biasing spring 89y biases the Y-direction driven nut member 85y in a direction to bring the Y-direction driven nut member 85y back into screw engagement with the Y-direction drive motor 170y in the case where the Y-direction driven nut member 85y is disengaged from the Y-direction drive motor 170y toward the Y-direction drive motor 170y side.

Figure 24:
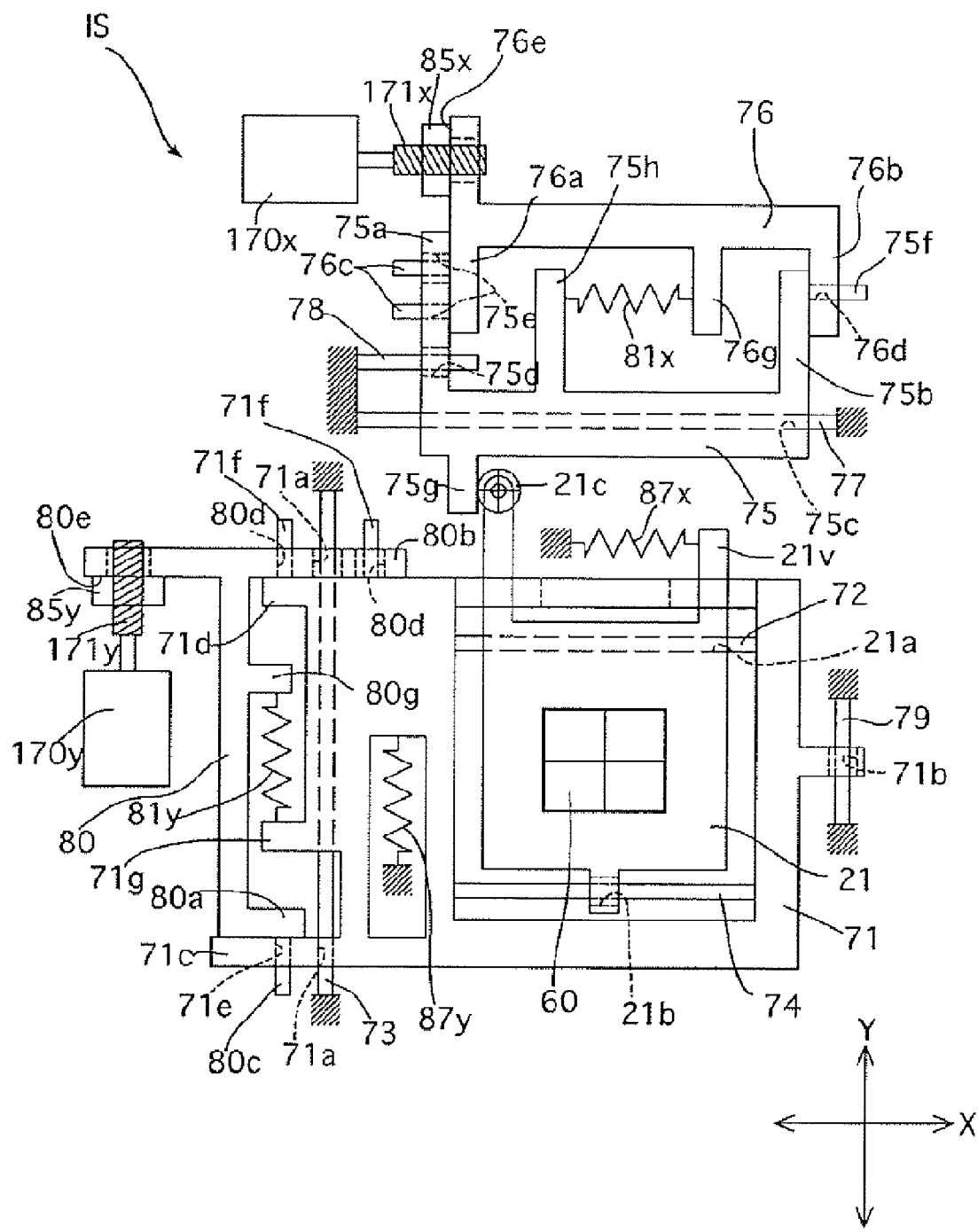
FIG. 24 is a diagrammatic illustration of the image stabilizing unit, showing the structure thereof.

FIG. 24 schematically shows the structure of the image stabilizing unit IS, viewed from the rear of the digital camera 200. Note that the relative position between the X-direction guide rod 78 and the pair of guide pins 76c, etc., are different from those shown in FIGS. 15 and 16 for the purpose of illustration. As can be understood from this schematic diagram, in the driving mechanism for driving the CCD image sensor 60 in the X-direction, the first X-direction moving member 75 and the second X-direction moving member 76 are coupled to each other resiliently by the biasing force of the extension joining spring 81x with the movement limit lug 75a and the movement limit lug 75b in contact with the movement limit lug 76a and the movement limit lug 76b, respectively. The biasing force of the X-direction stage biasing spring 87x is exerted on the first X-direction moving member 75 via the transfer roller 21c, which is in contact with the linkage projection 75g. Although the biasing force of the X-direction stage biasing spring 87x is exerted on the first X-direction moving member 75 leftward as viewed in FIG. 24, i.e., in a direction to disengage the movement limit lugs 75a and 75b from the movement limit lugs 76a and 76b, respectively, the biasing force (spring force) of the extension joining spring 81x is predetermined to be greater than that of the X-direction stage biasing spring 87x. Therefore, the first X-direction moving member 75 and the second X-direction moving member 76 are collectively biased leftward as viewed in FIG. 24 while maintaining the movement limit lugs 75a and 75b in resilient contact with the movement limit lugs 76a and 76b, respectively. Since the leftward movement of the second X-direction moving member 76 is limited by the engagement of the nut contacting portion 76e with the X-direction driven nut member 85x, the position of the X-direction driven nut member 85x serves as a reference position for each of the first X-direction moving member 75 and the second X-direction moving member 76 in the X-direction. As can be seen in FIG. 24, the end of the feed screw 171x extends through a through-hole (see FIGS. 15 and 16) formed on the nut contacting portion 76e so as not to interfere therewith.

Driving the X-direction drive motor 170x to rotate the drive shaft thereof (the feed screw 171x) causes the X-direction driven nut member 85x, that is screw-engaged with the feed screw 171x, to move linearly in the X-direction, thus causing the relative position between the first X-direction moving member 75 and the second X-direction moving member 76 in the X-direction to vary. For instance, if moved rightward with respect to the view shown in FIG. 24, the X-direction driven nut member 85x presses the nut contacting portion 76e in the same direction to thereby integrally move the first X-direction moving member 75 and the second X-direction moving member 76 rightward as viewed in FIG. 24 against the spring force of the X-direction stage biasing spring 87x. If the first X-direction moving member 75 is moved rightward with respect to the view shown in FIG. 24, the linkage projection 75g presses the transfer roller 21c in the same direction to thereby move the X-direction moving stage 21 rightward as viewed in FIG. 24. Conversely, if the X-direction driven nut member 85x is moved leftward as viewed in FIG. 24, the first X-direction moving member 75 and the second X-direction moving member 76 follow the X-direction driven nut member 85x to integrally move leftward as viewed in FIG. 24 by the biasing force of the X-direction stage biasing spring 87x. At this timer the X-direction moving stage 21 follows the first X-direction moving member 75 to move leftward as viewed in FIG. 24 by the biasing force of the X-direction stage biasing spring 87x. The linkage projection 759 and the transfer roller 21c are maintained in contact with each other at all times by the biasing force of the X-direction stage biasing spring 87x.

In the driving mechanism for driving the CCD image sensor 60 in the Y-direction, the Y-direction moving stage 71 and the Y-direction moving member 80 are resiliently coupled to each other via the extension joining spring 81y with the movement limit lugs 71c and 71d being in contact with the movement limit lugs 80a and 80b, respectively. Although the Y-direction moving stage 71 is biased downward as viewed in FIG. 24 by the spring force of the Y-direction stage biasing spring 87y, i.e., in a direction to disengage the movement limit lugs 71c and 71d from the movement limit lugs 80a and 80b, respectively, the biasing force (spring force) of the extension joining spring 81y is predetermined to be greater than that of the Y-direction stage biasing spring 87y. Therefore, the Y-direction moving stage 71 and the Y-direction moving member 80 are collectively biased downward while maintaining the movement limit lugs 71c and 71d in resilient contact with the movement limit lugs 80a and 80b, respectively. Since the downward movement of the Y-direction moving member 80 is limited by the engagement of the nut contacting portion 80e with the Y-direction driven nut member 85y, the position of the Y-direction driven nut member 85y serves as a reference position for each of the Y-direction moving stage 71 and the Y-direction moving member 80 in the Y-direction. As can be seen in FIG. 24, the end of the feed screw 171y extends through a through-hole (see FIGS. 15 and 16) formed on the nut contacting portion 80e so as not to interfere therewith.

Driving the Y-direction drive motor 170y to rotate the drive shaft thereof (the feed screw 171y) causes the Y-direction driven nut member 85y, that is screw-engaged with the feed screw 171y, to move linearly in the Y-direction, thus causing the relative position between the Y-direction moving stage 71 and the Y-direction moving member 80 in the Y-direction to vary. For instance, if the Y-direction driven nut member 85y is moved upward as viewed in FIG. 24, the Y-direction driven nut member 85y presses the nut contacting portion 80e in the same direction to thereby integrally move the Y-direction moving stage 71 and the Y-direction moving member 80 upward with respect to the view shown in FIG. 24 against the spring force of the Y-direction stage biasing spring 87y. Conversely, if the Y-direction driven nut member 85y is moved downward with respect to the view shown in FIG. 24, the Y-direction moving stage 71 and the Y-direction moving member 80 follow the Y-direction driven nut member 85y to integrally move downward by the biasing force of the Y-direction stage biasing spring 87y.

When the Y-direction moving stage 71 moves in the Y-direction, the X-direction moving stage 21 that is supported by the Y-direction moving stage 71 thereon moves together with the Y-direction moving stage 71. On the other hand, when the X-direction moving stage 21 moves together with the Y-direction moving stage 71 vertically in the Y-direction, the contacting point between the transfer roller 21c and the contacting surface of the linkage projection 75g varies because the first X-direction moving member 75, with which the transfer roller 21c is in contact, does not move in the Y-direction. At this time, the transfer roller 21c rolls on the contacting surface of the linkage projection 75g, so that the X-direction moving stage 21 can be moved in the Y-direction without exerting any driving force in the Y-direction to the first X-direction moving member 75.

According to the above described structure of the image stabilizing unit IS, the X-direction moving stage 21 can be moved forward and reverse in the X-direction by driving the X-direction drive motor 170x forward and reverse, respectively; and the Y-direction moving stage 71r together with the X-direction moving stage 21 that is supported by the Y-direction moving stage 71, can be moved forward and reverse in the Y-direction by driving the Y-direction drive motor 170y forward and reverse, respectively.

As shown in FIGS. 15 and 16, the first X-direction moving member 75 is provided in the vicinity of the movement limit lug 75a with a position detection lug 75i in the shape of a small thin plate. As shown in FIG. 17, the Y-direction moving stage 71 is provided in the vicinity of the movement limit lug 71c with a position detection lug 71h in the shape of a small thin plate. The image stabilizing unit IS is provided with a first photo-interrupter 103 (see FIGS. 9 and 25) and a second photo-interrupter 104 (see FIG. 25). The first photo-interrupter 103 detects the presence of the position detection lug 75i of the first X-direction moving member 75 that passes between mutually facing emitter/receiver elements when the light beam is blocked by the position detection lug 75i. Likewise, the second photo-interrupter 104 detects the presence of the position detection lug 71h of the Y-direction moving stage 71 that passes between mutually facing emitter/receiver elements when the light beam is blocked by the position detection lug 71h. The initial position of the first X-direction moving member 75 (the X-direction moving stage 21) in the X-direction can be detected by detecting the presence of the position detection lug 75i by the first photo-interrupter 103, while the initial position of the Y-direction moving stage 71 in the Y-direction can be detected by detecting the presence of the position detection lug 71h by the second photo-interrupter 104.

As shown in the block diagram in FIG. 25, the digital camera 200 is provided with an X-direction gyro sensor (angular velocity sensor) 105 and a Y-direction gyro sensor (angular velocity sensor) 106 which detect the angular velocity (angular speed) about two axes (the X-axis and the Y-axis) orthogonal to each other. The magnitude and the direction of camera shake (vibrations) applied to the digital camera 200 are detected by these two gyro sensors 105 and 106. Subsequently, the control circuit 102 determines a moving angle by time-integrating the angular velocity of the camera shake in the two axial directions, detected by the two gyro sensors 105 and 106. Subsequently, the control circuit 102 calculates from the moving angle the moving amounts of the image on a focal plane (imaging surface of the CCD image sensor 60) in the X-direction and in the Y-direction. The control circuit 102 further calculates the driving amounts and the driving directions of the X-direction moving stage 21 (the first X-direction moving member 75 and the second X-direction moving member 76) and the Y-direction moving stage 71 (the Y-direction moving member 80) for the respective axial directions (driving pulses for the X-direction drive motor 170x and the Y-direction drive motor 170y) in order to counteract camera shake. Thereupon, the X-direction drive motor 170x and the Y-direction drive motor 170y are actuated and the operations thereof are controlled in accordance with the calculated values, which counteracts image shake of an object image captured by the CCD image sensor 60. The digital camera 200 can be put into this image stabilization mode by turning on a photographing mode select switch 107 (see FIG. 25). If the photographing mode select switch 107 is in an off-state, the image stabilizing capability is deactivated so that a normal photographing operation is performed.

Additionally, by operating the photographing mode select switch 107, either a first tracking mode or a second tracking mode can be selected in the image stabilization mode. The image stabilizing capability remains activated by driving the X-direction drive motor 170x and the Y-direction drive motor 170y in the first tracking mode, while the image stabilizing capability is activated by driving the X-direction drive motor 170x and the Y-direction drive motor 170y only when a photometric switch 108 or a release switch 109 (see FIG. 25) provided in the digital camera 200 is turned ON in the second tracking mode. The photometric switch 108 is turned ON by depressing the shutter button 205 half way, and the release switch 109 is turned ON by fully depressing the shutter button 205.

Figure 13:
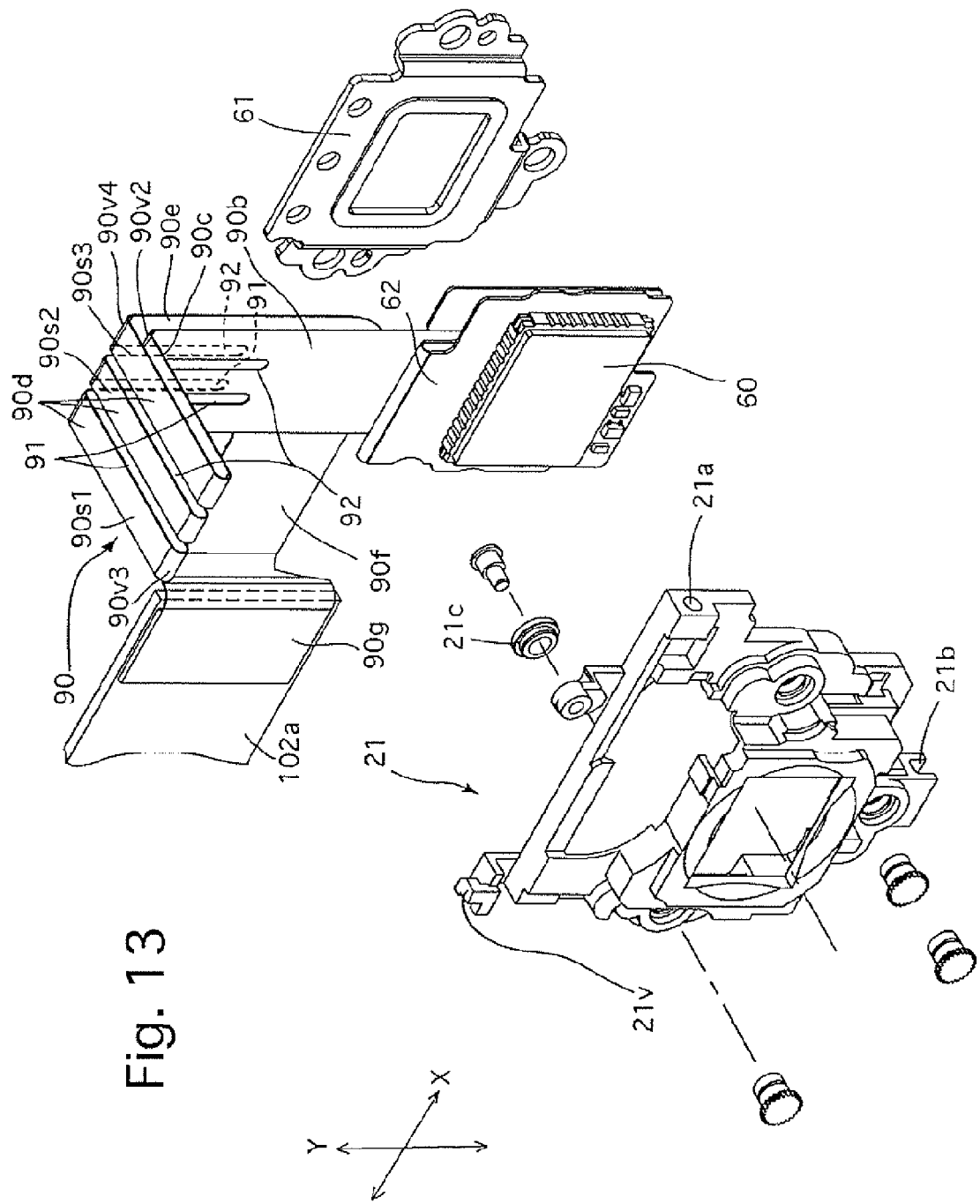
FIG. 13 is an exploded front perspective view of an X-direction moving stage, a CCD image sensor, a CCD retaining plate and associated elements shown in FIG. 11.
Figure 14:
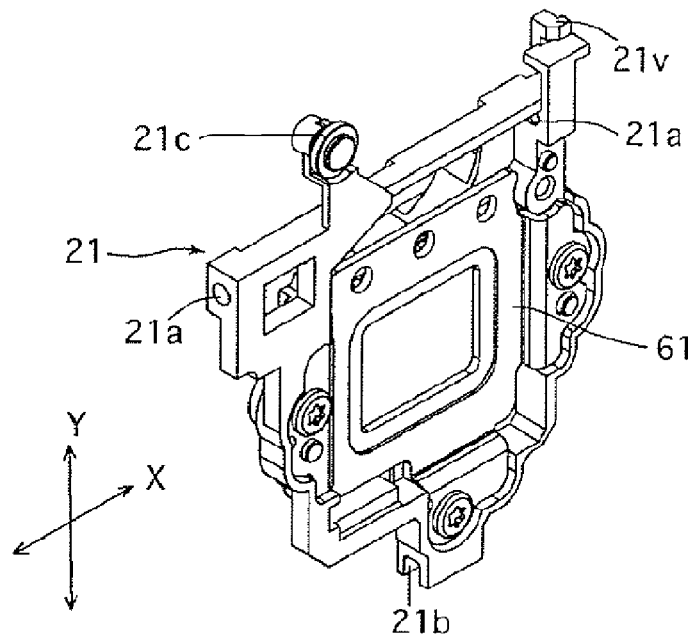
FIG. 14 is a rear perspective view of a portion of the image stabilizing unit shown in FIGS. 8 and 9 which includes the X-direction moving stage and the CCD retaining plate.

The control circuit 102 is mounted on a stationary circuit board 102a (see FIGS. 13 and 19) provided in the camera body 202, and the stationary circuit board 102a and the CCD image sensor 60 are electrically connected to each other via a flexible printed wiring board (hereinafter referred to as a flexible PWB) 90 adopted for image signal transmission. As shown in FIGS. 2, 3 and 13, the CCD image sensor 60 is held between the X-direction moving stage 21 and the CCD retaining plate 61. A CCD substrate 62 is formed integral with one end of the flexible PWB 90 and is electrically connected to the CCD image sensor 60 on the front side of the CCD retaining plate 61. The flexible PWB 90 is in the shape of a strip as a whole. The flexible PWB 90 is provided with a back fixed portion 90a, a U-shaped folded portion 90v1 (see FIGS. 2 and 3), a first vertical flat portion (intermediate flat portion) 90b, a bent portion 90v2, a first horizontal flat portion (parallel flat portion) 90c, a U-shaped folded portion 90v3, a second horizontal flat portion (parallel flat portion) 90d, a bent portion 90v4, a second vertical flat portion 90e, a laterally elongated portion 90f and a connector portion 90g. The back fixed portion 90a is fixed to the hack of the CCD retaining plate 61. A bottom end portion of the back fixed portion 90a is folded back upon itself to extend upward to form the U-shaped folded portion 90v1.

The first vertical flat portion 90b is elongated upward in the Y-direction from the U-shaped folded portion 90v1. An upper end of the first vertical flat portion 90b is bent forward at a substantially right angle to form the bent portion 90v2. The first horizontal flat portion 90c is elongated forward from the bent portion 90v2 above the zoom motor 150. A front end of the first horizontal flat portion 90c is folded back upon itself by substantially 180 degrees to extend rearward to form the U-shaped folded portion 90v3. The second horizontal flat portion 90d is elongated rearward from the U-shaped folded portion 90v3. A rear end portion of the second horizontal flat portion 90d is bent downward at a substantially right angle to form the bent portion 90v4. The second vertical flat portion 90e is elongated downward in the Y-direction from the bent portion 90v4. The laterally elongated portion 90f is laterally elongated in the X-direction from the lower end of the second vertical flat portion 90e. The connector portion 90g is formed at one end (left end as viewed in FIG. 19) of the laterally elongated portion 90f to be attached to the stationary circuit board 102a on which the control circuit 102 is mounted. The folding or bending lines of the U-shaped folded portion 90v1, the bent portion 90v2, the U-shaped folded portion 90v3 and the bent portion 90v4, along which the U-shaped folded portion 90v1, the bent portion 90v2, the U-shaped folded portion 90v3 and the bent portion 90v4 are folded or bent, are substantially parallel to the X-direction. The first vertical flat portion 90b and the second vertical flat portion 90e are substantially parallel to each other and the lengthwise directions of the first vertical flat portion 90b and the second vertical flat portion 90e are substantially parallel to the Y-direction. The first horizontal flat portion 90c and the second horizontal flat portion 90d are substantially parallel to each other and the lengthwise directions of the first horizontal flat portion 90c and the second horizontal flat portion 90d are substantially parallel to the photographing optical axis Z1. Note that the CCD substrate 62 and the flexible PWB 90 are not shown in each of the rear perspective views of FIGS. 9, 10 and 14.

Figure 19:
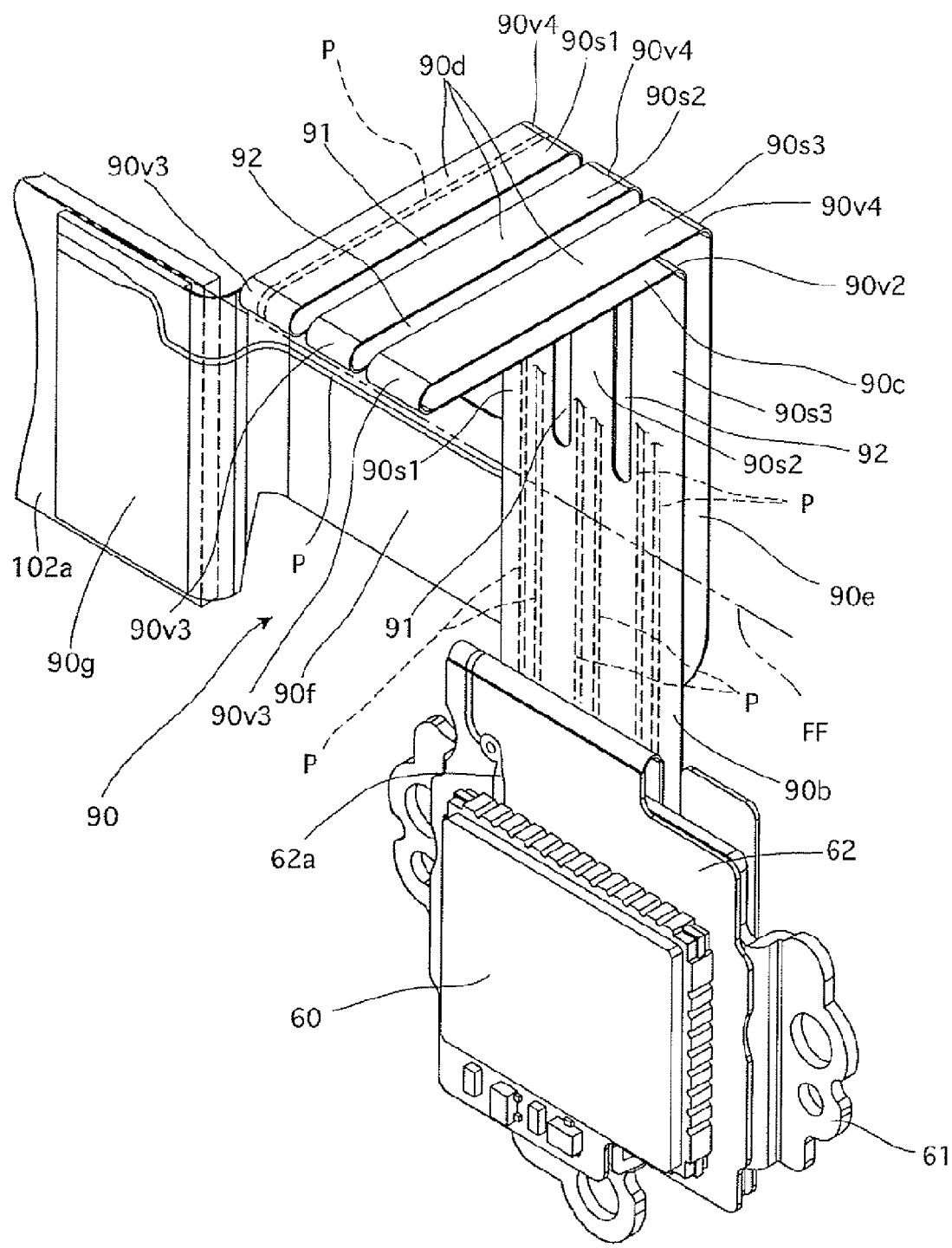
FIG. 19 is a front perspective view of the CCD image sensor, the CCD retaining plate and the associated elements shown in FIG. 13, showing the state of a flexible printed wiring board (which establishes electric connections between the CCD image sensor and a stationary circuit board) when the CCD image sensor is in the neutral position in the X-direction.

As shown in FIG. 19, the flexible PWB 90 is provided with a plurality of conductor traces P which electrically connect a circuit 62a fixed to the CCD substrate 62 with a circuit (not shown in FIG. 19) fixed to the stationary circuit board 102a. The conductor traces P extend from the CCD substrate 62 to the connector portion 90g and are arranged substantially parallel to one another along the lengthwise direction of the flexible PWB 90. In FIG. 19, only one of the conductor traces P is shown entirely from one end to the other end, and only portions the remaining conductor traces P which are formed on the first vertical flat portion 90b are shown for the purpose of illustration. In addition, although the number of conductor traces P shown in FIG. 19 is six, the number of conductor traces P is not limited solely to this particular number.

The flexible PWB 90 is configured to reduce a resistance in the flexible PWB 90 to movements of the CCD image sensor 60 when the CCD image sensor 60 is driven in the X-Y directions to counteract image shake. Since the first vertical flat portion 90b and the second vertical flat portion 90e are arranged so that the lengthwise directions thereof are in line with the Y-direction while the flexible PWB 90 is provided with a folded extension portion consisting of the first horizontal flat portion 90c, the U-shaped folded portion 90v3 and the second horizontal flat portion 90d so that a clearance is given to the length of the flexible PWB 90 in the Y-direction, the flexible PWB 90 can keep up with movements of the CCD image sensor 60 in the Y-direction while becoming flexibly deformed.

To reduce a resistance in the flexible PWB 90 to movements of the CCD image sensor 60 in the X-direction, i.e., in the widthwise direction of the flexible PWB 90, the flexible PWB 90 is provided with two slits (elongated cut-out openings) 91 and 92 which are formed so as not to interfere with the conductor traces P (see FIGS. 5, 8, 13 and 19 through 23). The two slits 91 and 92 are formed to extend in the lengthwise direction of the conductor traces P (see FIG. 19), ranging from a middle part of the first vertical flat portion 90b to a middle part of the second vertical flat portion 90e all the way through the first horizontal flat portion 90c and the second horizontal flat portion 90d (see FIG. 19). In other words, no part of the two slits 91 and 92 is formed in at least either one end of the flexible PWB 90 which is fixed to the CCD image sensor 60 (i.e., the back fixed portion 90a) or the other end of the flexible PWB 90 which is fixed to the stationary circuit board 102a (i.e., the laterally elongated portion 90f and the connector portion 90g). The two slits 91 and 92 are continuously formed in not only flat portions of the flexible PWB 90 from the aforementioned middle part of the first vertical flat portion 90b to the aforementioned middle part of the second vertical flat portion 90e but also the bent portion 90v2, the U-shaped folded portion 90v3 and the bent portion 90v4. In the region of the flexible PWB 90 in which the two slits 91 and 92 are formed in the lengthwise direction of the flexible PWB 90, the flexible PWB 90 is split into three in the widthwise direction thereof (the X-direction) to be provided with three strip portions 90s1, 90s2 and 90s3 having substantially the same width.

Figure 20:
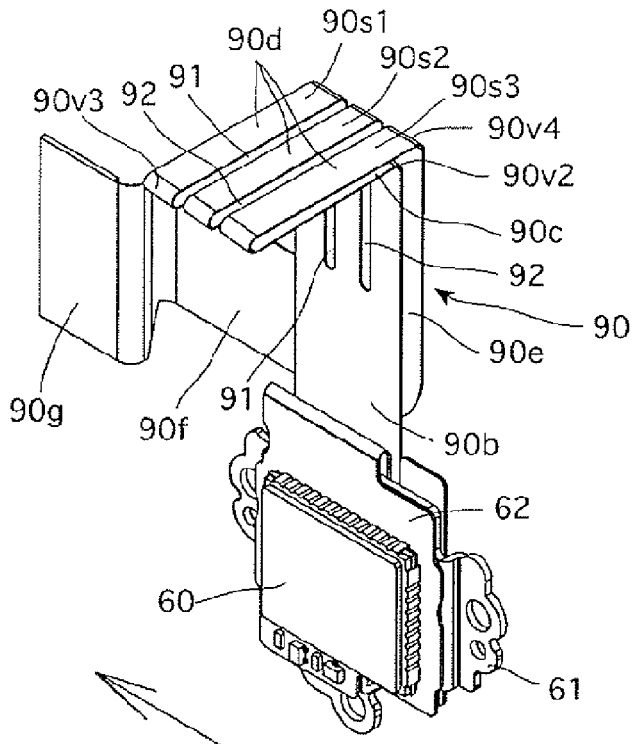
FIG. 20 is a front perspective view of the elements shown in FIG. 19, showing the state of the flexible printed wiring board when the CCD image sensor has been moved in one direction from the neutral position in the X-direction.
Figure 21:
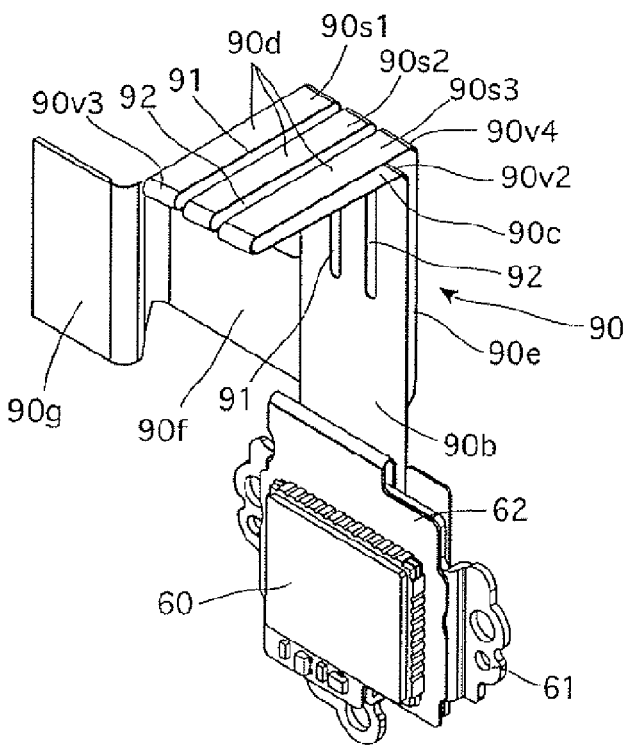
FIG. 21 is a front perspective view of the elements shown in FIG. 19, showing the state of the flexible printed wiring board when the CCD image sensor has been moved in the other direction from the neutral position in the X-direction.
Figure 22:
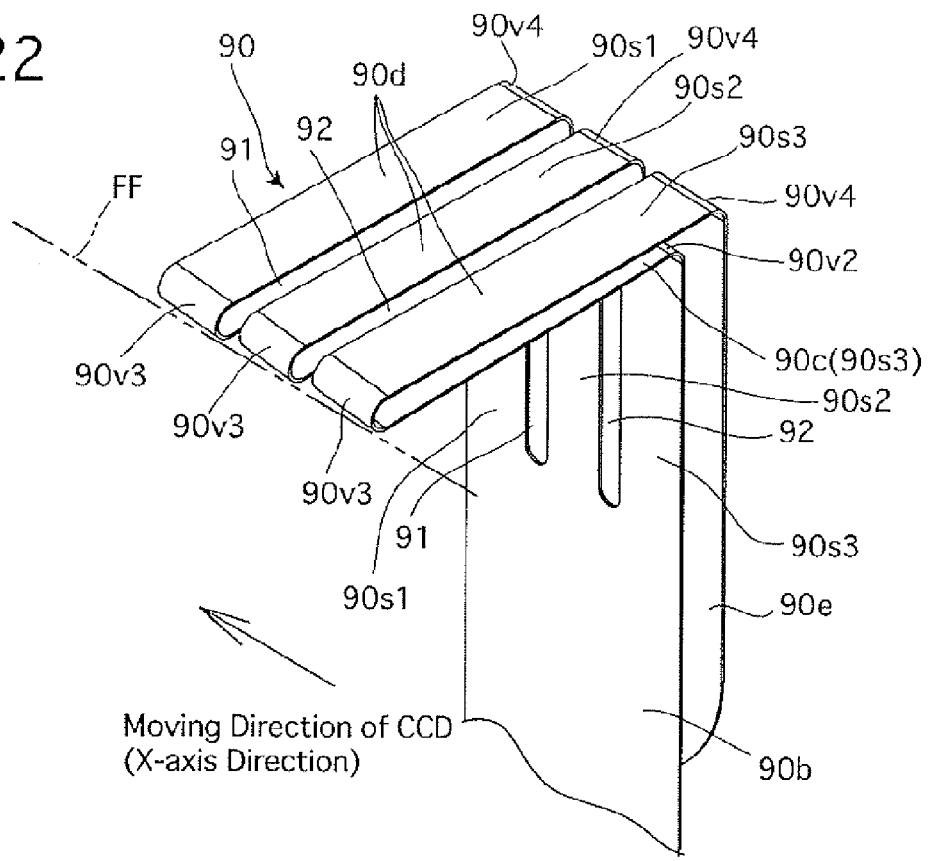
FIG. 22 is an enlarged front perspective view of a portion of the elastically-deformed flexible printed wiring board shown in FIG. 20.
Figure 23:
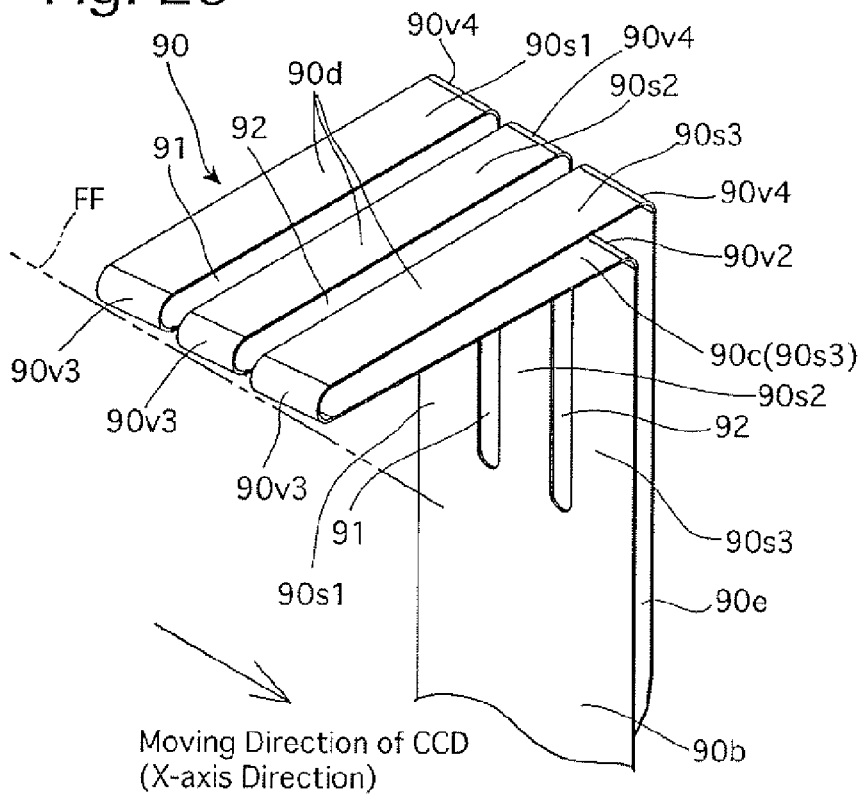
FIG. 23 is an enlarged front perspective view of a portion of the elastically-deformed flexible printed wiring board shown in FIG. 21.

FIG. 19 shows a state where the CCD image sensor 60 is in the central position (initial position/neutral position) in the range of movement of the CCD image sensor 60 in the X-direction. In this state, the front end positions of the three strip portions 90s1, 90s2 and 90s3 at the U-shaped folded portion 90v3 are aligned substantially in the X-direction. An imaginary line FF shown in FIG. 19 represents a straight line passing through the front end positions of the three strip portions 90s1, 90s2 and 90s3. Moving the CCD image sensor 60 forward and reverse in the X-direction as shown in FIGS. 20 and 21 from the position shown in FIG. 19 causes the flexible PWB 90 to be resiliently deformed in accordance with the amount of movement and the direction of the CCD image sensor 60. In FIGS. 22 and 23, a portion of the elastically-deformed flexible PWB 90 shown in FIGS. 20 and 21 is magnified for the purpose of making a resiliently deformed state of this portion clearly seen, respectively. As can be seen from the imaginary line FF shown in FIGS. 22 and 23 as a reference, the three strip portions 90s1, 90s2 and 90s3 are individually twisted to thereby absorb the effects of movements of the CCD image sensor 60 in the X-direction. Additionally, since the flexible PWB 90 is resiliently deformed to a sufficient degree in the portion of the flexible PWB which includes the three strip portions 90s1, 90s2 and 90s3, almost no variations in the position of the flexible PWB 90 occur at the lower end of the second vertical flat portion 90e and the laterally elongated portion 90f even if the CCD image sensor 60 moves forward or reverse in the X-direction, and accordingly, substantially no loads are exerted on the connector portion 90g.

Since the width of each of the three strip portions 90s1, 90s2 and 90s3 is smaller than the width of the whole flexible PWB 90, each of the three strip portions 90s1, 90s2 and 90s3 has a high flexibility and can thus be resiliently deformed easily, which makes it possible to minimize a resistance in the flexible PWB 90 to movements of the CCD image sensor 60 when the CCD image sensor 60 moves. For instance, if a simple solid flexible PWB having no slits like the two slits 91 and 92 of the flexible PWB 90 is used instead of the flexible PWB 90 that has the two slits 91 and 92, a greater force is required to make the flexible PWB resiliently deformed (twisted) in the widthwise direction thereof, which increases the aforementioned resistance in the flexible PWB to movements of the CCD image sensor 60 when the CCD image sensor 6C moves.

More specifically, although the flexible PWB 90 has a bent/folded shape having more than one bent/folded portions at more than one position, the widthwise direction of the flexible PWB except the laterally elongated portion 90f and the connector portion 90g (the direction orthogonal to the direction of elongation of the conductor traces P) are in line with the X-direction. In addition to this configuration, the slits 91 and 92 are formed along the direction of elongation of the conductor traces P (the lengthwise direction of the flexible PWB 90) that is orthogonal to the widthwise direction of the flexible PWB 90, and accordingly, the flexible PWB 90 can thus be resiliently deformed easily in the X-direction in response to movements of the CCD image sensor 60 in the X-direction. In other words, each of the two slits 91 and 92 is formed so that the lengthwise direction thereof is in line with a direction orthogonal to the X-direction at any region of the slit, which achieves an improvement in the flexibility of the flexible PWB 90 in the X-direction. Specifically, the flexible PWB 90 includes the aforementioned folded extension portion (which consists of the first horizontal flat portion 90c, the U-shaped folded portion 90v3 and the second horizontal flat portion 90d) that is firstly extended forward and subsequently folded back relative to a plane in which the imaging surface of the CCD image sensor 60 lies. Providing the flexible PWB 90 with this folded extension portion makes it possible for the flexible PWB 90 to be flexibly deformed in response to movements of the CCD image sensor 60 in the Y-direction to thereby produce an effect of reducing a resistance in the flexible PWB 90 to movements of the CCD image sensor 60 when the CDD image sensor 60 moves in the Y-direction. Additionally, making the slits 91 and 92 in the flexible PWB 90 so that each of the slits 91 and 92 passes through the U-shaped folded portion 90v3 that is positioned at the front end of the folded extension portion of the flexible PWB 90 makes it possible to achieve a high flexibility of the folded extension portion of the flexible PWB 90 which will not be easily deformable in the widthwise direction thereof if the flexible PWB 90 is not provided with the slits 91 and 92, and further makes it possible to minimize a resistance in the flexible PWB 90 to movements of the CCD image sensor 60 by having the flexible PWB 90 deformed flexibly in response to movements of the CCD image sensor 60 in the X-direction. Note that the slits 91 and 92 do not interfere with either the efficiency of conductor-trace wiring of the flexible PWB 90 or the pattern of the conductor traces P of the flexible PWB 90 because each of the slits 91 and 92 is an elongated opening (elongated cut-out opening) parallel to the direction of elongation of the conductor traces P.

As described above, using the present embodiment of the flexible PWB 90 makes it possible for the CCD image sensor 60 to be driven stably with a high degree of precision. Moreover, since a resistance in the flexible PWB 90 to movements of the CCD image sensor 60 when the CCD image sensor 60 moves is small, the load on the X-direction drive motor 170x is specifically reduced, so that a reduction in power consumption is achieved. Furthermore, the flexibility of the flexible PWB 90 can be improved without making any modification to the material of the flexible PWB 90, which makes it possible to prevent an increase in the production cost.

Figure 26:
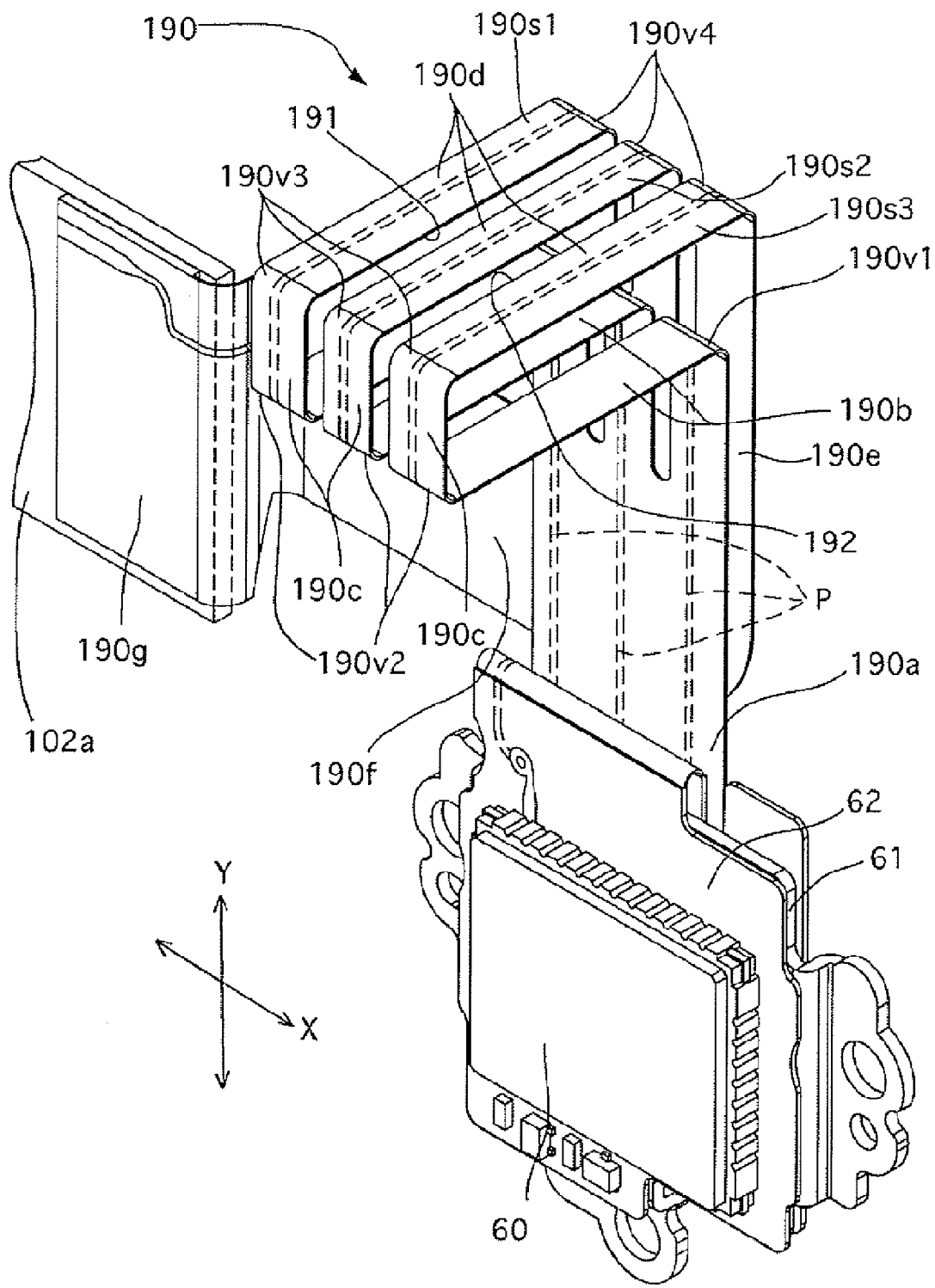
FIG. 26 is a view similar to that of FIG. 19, showing a second embodiment of the optical apparatus according to the present invention in which a flexible printed wiring board having a different structure is used.

FIG. 26 is a view similar to that of FIG. 19, showing a second embodiment of the optical apparatus according to the present invention in which a flexible PWB 190 different in structure from the flexible PWB shown in FIG. 19 is used. Similar to the flexible PWB 90 in the previous embodiment of the optical apparatus, the flexible PWB 190 is provided at one end thereof with a CCD substrate 62 that is formed integral therewith, and is further provided at the back of the CCD retaining plate 61 with a back fixed portion (not shown in FIG. 26) which extends from the CCD substrate 62. The flexible PWB 190 is further provided with a first vertical flat portion (intermediate flat portion) 190a, a bent portion 190v1, a first horizontal flat portion (parallel flat portion) 190b, a bent portion 190v2, a connecting flat portion 190c, a bent portion 190v3, a second horizontal flat portion (parallel flat portion) 190d, a bent portion 190v4, a second vertical flat portion 190e, a laterally elongated portion 190f and a connector portion 190g. The first vertical flat portion 190a is elongated upward in the Y-direction from the aforementioned back fixed portion of the flexible PWB 190. An upper end of the first vertical flat portion 190a is bent forward at a substantially right angle to form the bent portion 190v1. The first horizontal flat portion 190b is elongated forward from the bent portion 190v1. A front end of the first horizontal flat portion 190b is bent upward at a substantially right angle to form the bent portion 190v2. The connecting flat portion 190c is elongated upward from the bent portion 190v2 and an upper end of the connecting flat portion 190c is bent rearward at a substantially right angle to form the bent portion 190v3. The second horizontal flat portion 190d is elongated rearward from the bent portion 190v3. A rear end portion of the second horizontal flat portion 190d is bent downward at a substantially right angle to form the bent portion 190v4. The second vertical flat portion 190e is elongated downward in the Y-direction from the bent portion 190v4. The laterally elongated portion 190f is laterally elongated in the X-direction from the lower end of the second vertical flat portion 190e. The connector portion 190g is formed at one end (left end as viewed in FIG. 26) of the laterally elongated portion 190f to be attached to the stationary circuit board 102a on which the control circuit 102 is mounted. The bending lines of the bent portions 190v1, 190v2, 190v3 and 190v4, along which these bent portions are bent, respectively, are substantially parallel to the X-direction. The first vertical flat portion 190a and the second vertical flat portion 190e are substantially parallel to each other and the lengthwise directions of the first vertical flat portion 190a and the second vertical flat portion 190e are substantially parallel to the Y-direction. The first horizontal flat portion 190b and the second horizontal flat portion 190d are substantially parallel to each other and the lengthwise directions of the first horizontal flat portion 190b and the second horizontal flat portion 190d are substantially parallel to the photographing optical axis Z1. The flexible PWB 190 is provided with a plurality of conductor traces P which electrically connect a circuit (not shown in FIG. 26) on the CCD substrate 62 with a circuit (not shown in FIG. 26) on the stationary circuit board 102a.

Similar to the flexible PWB 90 in the previous embodiment of the optical apparatus, the flexible PWB 190 is provided with a folded extension portion that is extended firstly forward and thereafter backward relative to a plane in which the imaging surface of the CCD image sensor 60 lies. This folded extension portion consists of the first horizontal flat portion 190b, the connecting flat portion 190c and the second horizontal flat portion 190d. The bent portion 190v2, the bent portion 190v3 and the connecting flat portion 190c, which is positioned between the bent portions 190v2 and 190v3, constitute a folded portion of the flexible PWB 190 which corresponds to the U-shaped folded portion 90v3 of the flexible PWB 90 that is provided in the previous embodiment of the optical apparatus.

The flexible PWB 190 is provided at different positions in the widthwise direction thereof with two slits (elongated cutout openings) 191 and 192 which are formed so as not to interfere with the conductor traces P. The two slits 191 and 192 are formed along the direction of elongation of the conductor traces P, i.e., the lengthwise direction of the flexible PWB 190f ranging from a middle part of the first vertical flat portion 190a to a middle part of the second vertical flat portion 190e all the way through the folded extension portion (190b, 190c and 190d) of the flexible PWB 190. In the region of the flexible PWB 190 in which the two slits 191 and 192 are formed in the lengthwise direction of the flexible PWB 190, the flexible PWB 190 is split into three in the widthwise direction thereof (the X-direction) to be provided with three strip portions 19s1, 190s2 and 190s3 having substantially the same width. Similar to the slits 91 and 92 made in the flexible PWB 90 in the first embodiment of the optical apparatus, providing the slits 191 and 192 in the flexible PWB 190 makes it possible to minimize a resistance in the flexible PWB 190 to movements of the COD image sensor 60 by having the flexible PWB 190 deformed flexibly in response to movements of the CCD image sensor 60 in the X-direction. Accordingly, the shape of the folded extension portion of the flexible PWB in which the slits (91 and 92, or 191 and 192) are provided is not limited solely to the particular shape of a simple U-shaped folded portion such as the U-shaped folded portion 90v3 of the flexible PWB 90 provided in the first embodiment of the optical apparatus, alternative shaped folded portions are also possible.

Figure 27:
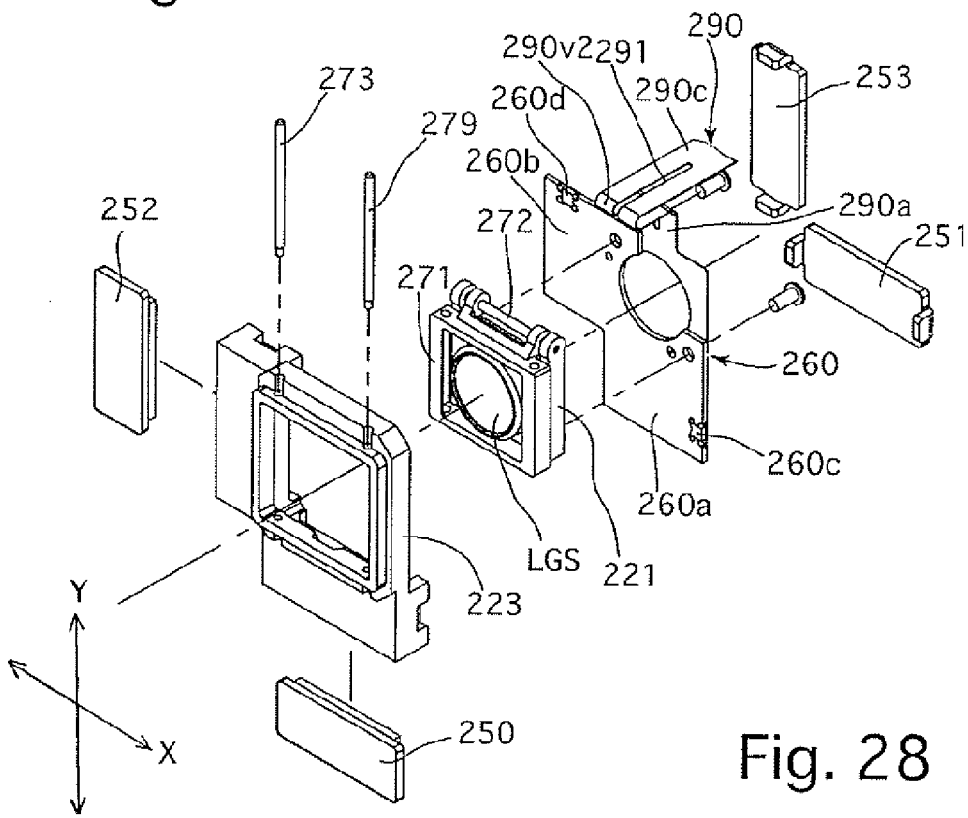
FIG. 27 is an exploded perspective view of an image stabilizing unit which is incorporated in a third embodiment of the optical apparatus according to the present invention, wherein the image stabilizing unit includes a lens group serving as an image-stabilizing optical element.
Figure 28:
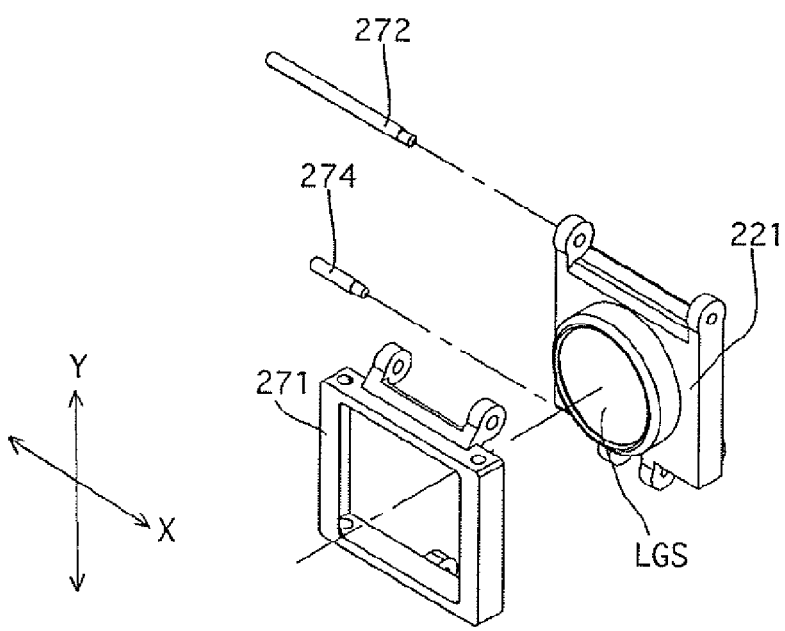
FIG. 28 is an exploded perspective view of a portion of the image stabilizing unit shown in FIG. 27 which includes a lens frame and an intermediate frame.
Figure 29:
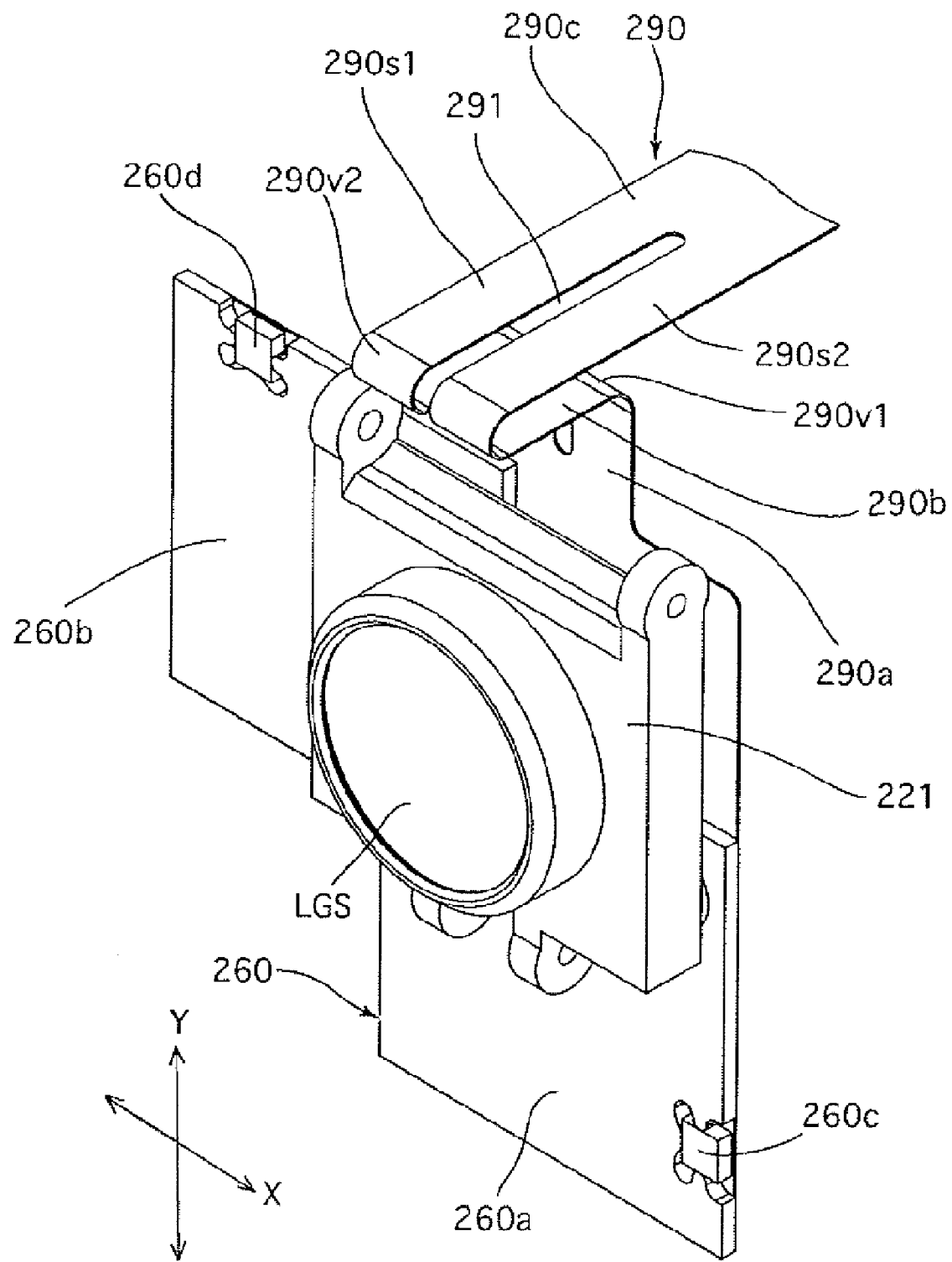
FIG. 29 is a perspective view of the lens frame and the coil base plate of the image stabilizing unit shown in FIG. 27 in an assembled state.

FIGS. 27 through 29 show a third embodiment of the optical apparatus according to the present invention. In the image stabilizing unit in the third embodiment of the optical apparatus, instead of an image pickup device (the CCD image sensor 60), a shake correcting lens (lens group) LGS is moved in a plane orthogonal to a photographing optical axis to counteract image shake. The image stabilizing unit is provided with a coil base plate (shake-correction unit) 260 which serves as an electrical component that is adopted for driving the shake correcting lens LGS. The shake correcting lens LGS is held by a lens frame (X-direction moving stage) 221. The lens frame 221 is supported by an intermediate frame (Y-direction moving stage) 271 to be movable in the X-direction via a pair of X-direction guide shafts to 272 and 27 which extend in the X-direction. The intermediate frame 271 is supported by a unit mother board 223 so as to be movable in the Y-direction via a pair of Y-direction guide shafts 273 and 279 which extend in the Y-direction. The coil base plate 260 is fixed to the back of the lens frame 221 (see FIG. 29). The image stabilizing unit is provided with a total of four yokes 250, 251, 252 and 253. Specifically, the two yokes 250 and 252 and the remaining two yokes 251 and 253 are fixed to the front and back of the unit mother board 223, respectively, with the coil base plate 260 being positioned between the yokes 250 and 252 and the yokes 251 and 253. These four yokes constitute a magnetic field generator. The pair of yokes 250 and 251 are positioned in front of and behind a coil portion (drive coil) 260a of the coil base plate 260, respectively, while the pair of yokes 252 and 253 are positioned in front of and behind a coil portion (drive coil) 260b of the coil base plate 260, respectively.

An electric current is applied to each of the two coil portions 260a and 260b via a flexible PWB 290. Passing an electric current through the coil portion 260a causes the shake correcting lens LGS (the lens frame 221) to move in the Y-direction by an electromagnetic force, and passing an electric current through the coil portion 260b causes the shake correcting lens LGS (the intermediate frame 271) to move in the X-direction by an electromagnetic force. The coil base plate 260 is provided thereon with two position sensors 260c and 260d for detecting the position (the amount of movement) of the shake correcting lens LGS in the X-direction and the Y-direction, respectively. Signals (positional signals) output from the two position sensors 260c and 260d are sent to a control circuit (not shown) via the flexible PWB 290. With the image stabilizing unit shown in FIG. 27 that has the above described structure, the shake correcting lens LGS can be moved as appropriate in the X-Y directions to counteract image shake in accordance with the direction and the magnitude of vibration (shake) applied to an imaging optical system which includes the shake correcting lens LGS.

As shown in FIG. 29, the flexible PWB 290 is provided with a vertical flat portion (intermediate flat portion) 290a, a bent portion 290v1, a first horizontal flat portion (parallel flat portion) 290b, a U-shaped folded portion 290v2 and a second horizontal flat portion (parallel flat portion) 290c. The vertical flat portion 290a is elongated upward in the Y-direction from the coil base plate 260. An upper end of the vertical flat portion 290a is bent forward at a substantially right angle to form the bent portion 290v1. The first horizontal flat portion 290b is elongated forward from the bent portion 290v1. A front end of the first horizontal flat portion 290b is folded back upon itself by substantially 180 degrees to extend rearward to form the U-shaped folded portion 290v2. The second horizontal flat portion 290c is elongated rearward from the U-shaped folded portion 290v2. Although the illustration of the remaining part of the flexible PWB 290 from the rear end of the second horizontal flat portion 290c onwards is omitted in FIG. 29, this part of the flexible PWB 290 is connected to a control circuit (stationary board) which has the capability of supplying power to the coil base plate 260 (the coil portions 260a and 260b).

The flexible PWB 290 is provided with a slit (elongated cut-out opening) 291. The slit 291 is formed to extend in the lengthwise direction of the flexible PWB 290, ranging from a middle part of the vertical flat portion 290a to a middle part of the second horizontal flat portion 290c through the U-shaped folded portion 290v2. In the region of the flexible PWB 290 in which the slit 291 is formed in the lengthwise direction of the flexible PWB 290, the flexible PWB 290 is split into two in the widthwise direction thereof to be provided with two strip portions 290s1 and 290s2. Although the flexible PWB 290 is acted upon by a force which moves the flexible PWB 290 in the X-Y directions as the shake correcting lens LGS and the coil base plate 260 move, providing the flexible PWB 290 with a folded extension portion consisting of the first horizontal flat portion 290b, the U-shaped folded portion 290v2 and the second horizontal flat portion 290c makes it possible for the flexible PWB 290 to be flexibly deformed in response to movements of the coil base plate 260 in the Y-direction to thereby produce an effect of reducing a resistance which the flexible PWB 290 provides to movements of the coil base plate 260 when the coil base plate 260 moves in the Y-direction. Additionally, providing the slit 291 in the flexible PWB 290 so that the slit 291 passes through the u-shaped folded portion 290v2 makes it possible for the flexible PWB 290 to be flexibly deformed in response to movements of the coil base plate 260 in the X-direction to thereby produce an effect of reducing a resistance in the flexible PWB 290 to movements of the coil base plate 260 when the coil base plate 260 moves in the X-direction. As can be understood from the embodiment shown in FIGS. 27 through 29, the electrical component to which a flexible PWB is connected is not limited solely to an image pickup device and the use of the flexible PWB is not limited solely to a particular use of the image signal transmission.

Although the present invention has been discussed above with reference to the specific illustrated embodiments described above, the present invention is not limited solely thereto. For instance, the region of the flexible PWB in which one or more slits are formed and the number of the slits can be optionally modified so long as such modifications do not depart from the gist of the present invention. For instance, although two slits (91 and 92 or 191 and 192) are formed in the flexible PWB (90 or 190) in each of the first embodiment shown in FIGS. 1 through 25 and the second embodiment shown in FIG. 26, and one slit 291 is formed in the flexible PWB 290 in the third embodiment shown in FIGS. 27 through 29, it is possible that more than two slits be formed in the flexible PWB.

Although the movable electrical component to which a flexible PWB is connected operates for the purpose of counteracting image shake by moving in directions orthogonal to an optical axis in each of the above described embodiments, the present invention can also be applied to an electrical component which is moved in directions orthogonal to an optical axis for any other purpose.

In optical apparatuses using an image pickup device, it is generally the case that the image pickup device is installed at the rearmost end of an optical system. Considering miniaturization of the optical apparatus, it is difficult to provide space behind the image pickup device. Therefore, in the case where the movable electrical component, to which a flexible PWB is connected, is an image pickup device, it is desirable that the folded extension portion of the flexible PWB be extended forward in the optical axis direction such as the folded extension portion of the flexible PWB 90 or 190 of each of the first and second embodiments of the optical apparatuses. However, the present invention is not limited solely to this particular configuration. For instance, it is possible that the folded extension portion of the flexible PWB be extended rearward in the optical axis direction in the case, e.g. where an electrical component to which the present invention is applied is installed at some midpoint in an optical system.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An optical apparatus including an electrical component which is movable in a plane, and a flexible printed wiring board in the shape of a strip, a widthwise direction thereof being parallel to said plane, which connects said electrical component to a stationary board, wherein said flexible printed wiring board comprises:

a folded extension portion which firstly extends in a direction substantially orthogonal to said plane and is subsequently folded back at a folded portion to extend in a direction opposite thereto; and at least one slit which is provided to pass through said folded portion and to split at least a part of said folded extension portion into at least two split portions thereof in said widthwise direction of said flexible printed wiring board.

2. The optical apparatus according to claim 1, wherein said slit is elongated in a substantially lengthwise direction of said flexible printed wiring board.

3. The optical apparatus according to claim 1, wherein said folded extension portion comprises a pair of parallel flat portions between which said folded portion of said folded extension portion is provided, said pair of parallel flat portions extending substantially orthogonal to said plane, and wherein said slit extends over said pair of parallel flat portions through said folded portion of said folded extension portion.

4. The optical apparatus according to claim 1, wherein said electrical component is linearly movable in said plane in a first direction parallel to a widthwise direction of said folded extension portion and a second direction substantially orthogonal to said first direction, wherein said flexible printed wiring board comprises an intermediate flat portion installed between said folded extension portion and said electrical component to extend substantially parallel to said second direction, and wherein said slit extends from said folded extension portion to said intermediate flat portion.

5. The optical apparatus according to claim 1, wherein said flexible printed wiring board comprises a plurality of said slits provided at different positions in said widthwise direction thereof.

6. The optical apparatus according to claim 1, wherein said electrical component comprises an image pickup device.

7. The optical apparatus according to claim 6 further comprising an image stabilizing device which moves said image pickup device in said plane that is parallel to an imaging surface of said image pickup device in accordance with a magnitude and a direction of shake applied to an optical system to offset image shake of an object image formed on said imaging surface.

8. The optical apparatus according to claim 6, wherein said folded extension portion is installed to extend forward relative to a plane in which an imaging surface of said image pickup device lies.

9. The optical apparatus according to claim 1, further comprising a shake correcting lens group movable in directions orthogonal to an optical axis of an optical system, wherein said electrical component serves as a component of a drive mechanism which moves said shake correcting lens in a plane orthogonal to said optical axis in accordance with a magnitude and a direction of shake applied to said optical system to offset image shake of an object image formed on an imaging surface.

10. The optical apparatus according to claim 1, wherein said optical apparatus comprises a digital camera, and wherein said electrical component comprises one of an image pickup device and a board to which drive coils are fixed.

11. The optical apparatus according to claim 1, wherein said slit is elongated in a direction substantially parallel to conductive traces provided in said flexible printed wiring board.

12. The optical apparatus according to claim 1, wherein said slit has a sufficient width so that each said split portions do not interfere with each other even if twisted in response to movements of said electrical component when said electrical component is moved.

13. An optical apparatus including an electrical component which is movable in a plane, and a flexible printed wiring board in the shape of a strip, the widthwise direction thereof being parallel to said plane, which connects said electrical component to a stationary board, wherein said flexible printed wiring board comprises:

first and second flat portions which extend in a direction substantially orthogonal to said plane respectively;

a folded portion which connects said first flat portion and said second flat portion; and at least one slit which is provided to pass through said folded portion and to split said folded portion into at least two split portions thereof in said widthwise direction of said flexible printed wiring board.

14. An optical apparatus including an image pickup device which is movable in a plane substantially parallel to an imaging surface, and a flexible printed wiring board in the shape of a strip which connects said image pickup device to a stationary board, wherein said flexible printed wiring board comprises:

a folded extension portion which firstly extends in a direction substantially orthogonal to said plane and is subsequently folded back to extend in a direction opposite thereto; and at least one slit which is provided in said flexible printed wiring board to pass through at least a folded portion of said folded extension portion and to split at least a part of said flexible printed wiring board which includes said folded extension portion into at least two split portions thereof in a widthwise direction of said flexible printed wiring board.

15. An optical apparatus including a shake-correction unit driven magneto-electrically in a plane orthogonal to an optical axis, and a flexible printed wiring board in the shape of a strip which connects said shake-correction unit to a stationary board, wherein said flexible printed wiring board comprises a folded extension portion which firstly extends in a direction substantially orthogonal to said plane and is subsequently folded back to extend in a direction opposite thereof, and wherein at least a portion of said flexible printed wiring board which includes said folded extension portion is split into at least two split portions in a widthwise direction of said flexible printed wiring board so that said two split portions are elongated in a lengthwise direction of said flexible printed wiring board and so that said two split portions do not interfere with each other even if twisted in response to movements of said shake-correction unit when said shake-correction unit is driven.

\* \* \* \* \*